(12) United States Patent
Min et al.

(10) Patent No.: US 8,852,979 B2
(45) Date of Patent: Oct. 7, 2014

(54) MICRO-PATTERN FORMING METHOD, AND MICRO-CHANNEL TRANSISTOR AND MICRO-CHANNEL LIGHT-EMITTING TRANSISTOR FORMING METHOD USING SAME

(75) Inventors: Sung Yong Min, Gwangju (KR); Tae Sik Kim, Hanam-si (KR); Tae-Woo Lee, Pohang-si (KR)

(73) Assignee: Postech Academy-Industry Foundation (KR)

( * ) Notice: Subject to any disclaimer, the term of this patent is extended or adjusted under 35 U.S.C. 154(b) by 0 days.

(21) Appl. No.: 13/877,875

(22) PCT Filed: Oct. 6, 2011

(86) PCT No.: PCT/KR2011/007413
§ 371 (c)(1),
(2), (4) Date: Apr. 4, 2013

(87) PCT Pub. No.: WO2012/047042
PCT Pub. Date: Apr. 12, 2012

(65) Prior Publication Data
US 2013/0203198 A1 Aug. 8, 2013

(30) Foreign Application Priority Data

Oct. 7, 2010 (KR) .................. 10-2010-0097996
Oct. 4, 2011 (KR) .................. 10-2011-0100763

(51) Int. Cl.
| H01L 21/00 | (2006.01) |
| B81C 1/00 | (2006.01) |
| H01L 51/00 | (2006.01) |
| H01L 51/10 | (2006.01) |
| H01L 51/42 | (2006.01) |
| H01L 51/05 | (2006.01) |

(52) U.S. Cl.
CPC ........ H01L 51/0005 (2013.01); B81C 1/00031 (2013.01); H01L 51/0023 (2013.01); H01L 51/102 (2013.01); H01L 51/0016 (2013.01); H01L 51/0545 (2013.01); H01L 51/428 (2013.01); H01L 51/0541 (2013.01)

USPC .......... 438/46; 438/38; 438/99; 257/E21.001; 257/E21.09

(58) Field of Classification Search
USPC ................... 257/292, 615, E21.001, E21.09; 118/600–612, 620–643; 427/457, 466, 427/471, 528, 531, 541
See application file for complete search history.

(56) References Cited

U.S. PATENT DOCUMENTS

| 7,645,625 B2 * | 1/2010 | Ono et al. ................. 438/38 |
| 2002/0003125 A1 * | 1/2002 | Knappenberger et al. ...... 216/42 |

(Continued)

FOREIGN PATENT DOCUMENTS

| JP | 2010041023 A | 2/2010 |
| KR | 10-20080013366 | 2/2008 |

(Continued)

OTHER PUBLICATIONS

International Search Report, PCT Application No. PCT/KR2011/007413, May 1, 2012, 7 pp.

(Continued)

*Primary Examiner* — Charles Garber
*Assistant Examiner* — Abdulfattah Mustapha
(74) *Attorney, Agent, or Firm* — Myers Bigel Sibley & Sajovec

(57) ABSTRACT

Provided is a method of forming a micropattern according to an aspect of the present invention. The method of forming a micropattern may include forming an organic wire or organic-inorganic hybrid wire mask pattern having a circular or elliptical cross section on a substrate, forming a material layer on an entire surface of the substrate having the organic wire or organic-inorganic hybrid wire mask pattern formed thereon, and removing the organic wire or organic-inorganic hybrid wire mask pattern from the substrate to allow only the material layer on a portion of the substrate having no organic wire or organic-inorganic hybrid wire mask pattern formed thereon to be remained.

17 Claims, 17 Drawing Sheets

(56) References Cited

U.S. PATENT DOCUMENTS

2008/0290383 A1* 11/2008 Dunne et al. .................. 257/292
2010/0032409 A1 2/2010 Hong et al.

FOREIGN PATENT DOCUMENTS

| KR | 10-20100060226 | 6/2010 |
| KR | 10-20100071424 | 6/2010 |
| KR | 10-0981733 B | 9/2010 |
| WO | WO 2004/013922 A2 | 2/2004 |

OTHER PUBLICATIONS

Written Opinion of the International Searching Authority, PCT/KR2011/007413, Date of Mailing: May 1, 2012, 20 pp.

L. Qin et al.; "On-Wire Lithography"; vol. 309, Jul. 1, 2005, pp. 113-115.

A. Colli et al.; "Nanowire Lithography on Silicon"; Nano Letters, vol. 8, No. 5 (2008); pp. 1358-1362.

J. Shi et al.; "Assembly of arbitrary and vertical optical couplers using flexible polymer micro/nanowires"; Applied Physics Letters 93, 121101-1 (2008); 3 pages.

J. T. Kim et al.; "Three-Dimensional Writing of Conducting Polymer Nanowire Arrays by Meniscus-Guided Polymerization"; Advanced Materials, vol. 23, (2011) pp. 1968-1970.

S. Kase et al.; "Studies on Melt Spinning. I. Fundamental Equations on the Dynamics of Melt Spinning"; Journal of Polymer Science: Part A., vol. 3, (1965), pp. 2541-2554.

G. C. East et al.; "Wet Spinning of Chitosan and the Acetylation of Chitosan Fibers"; Department of Textile Industries, University of Leeds LS2 9JT, 1993 John Wiley & Sons, Inc., England; Journal of Applied Polymer Science, vol. 50, (1993), pp. 1773-1779.

S. Gogolewski et al.; "High-modulus fibres of nylon-6 prepared by a dry-spinning method"; Polymer, 1985 Butterworth & Co. Ltd.; vol. 26, August (Conference Issue), pp. 1394-1400.

R. Fukae et al.; "Gel-spinning and drawing of gelatin"; Polymer, vol. 46 (2005), pp. 11193-11194.

V. Thavasi et al.; "Electrospun nanofibers in energy and environmental applications"; Energy & Environmental Science, vol. 1, The Royal Society of Chemistry 2008; pp. 205-221.

D. H. Reneker et al.; "Bending instability of electrically charged liquid jets of polymer solutions in electrospinning" Journal of Applied Physics, vol. 87, published by the American Institute of Physics, (2000), pp. 4531-4547.

D. Whang et al.; "Nanolithography Using Hierarchically Assembled Nanowire Masks"; 2003 American Chemical Society; vol. 3, No. 7, pp. 951-954.

* cited by examiner

MICRO-PATTERN FORMING METHOD, AND MICRO-CHANNEL TRANSISTOR AND MICRO-CHANNEL LIGHT-EMITTING TRANSISTOR FORMING METHOD USING SAME

CROSS-REFERENCE TO RELATED APPLICATIONS

This application is a 35 U.S.C. §371 national stage application of PCT International Application No. PCT/KR2011/007413, filed on 6 Oct. 2011, which claims priority to Korean Patent Application Nos. 10-2010-0097996 filed on 7 Oct. 2010 and 10-2011-0100763 filed on 4 Oct. 2011, the disclosures of which are incorporated by reference herein in their entireties. The above-referenced PCT International Application was published in the Korean language as International Publication Nos. WO 2012/047042 A2 and A3 on 12 Apr. 2012.

TECHNICAL FIELD

The present invention relates to a method of forming a micropattern using an organic wire or an organic-inorganic hybrid wire, and more particularly, to a method of forming a micropattern using an organic wire or an organic-inorganic hybrid wire as a patterning mask and a method of forming an electronic device using the same.

BACKGROUND ART

Currently, since most of processes able to form nanoscale patterns on a substrate are based on vacuum technologies, these processes are complicated and expensive. For example, electron (E)-beam lithography may form micropatterns in vacuum. However, since a region on which a pattern may be formed is relatively localized, a relatively large amount of time and costs may be necessary in order to form a micropattern over a large area. Also, with respect to photolithography used in a semiconductor process, a size of a pattern is affected by a wavelength of a light source. Thus, an expensive piece of equipment using a deep ultraviolet (UV) light source, such as a 248 nm KrF excimer laser or 193 nm ArF excimer laser, must be included in order to realize a nanoscale pattern. Nevertheless, resolution may be limited to about 0.1 μm. Therefore, new technical approaches may be required for reducing the size of the pattern as well as costs.

Mirkin and his colleagues at Northwestern University used metal nanowires in preparing electrodes having a nanospacing (see L. Qin, S. Park, L. Huang, C. A. Mirkin, *Science,* 309, 113-115 (2005)). Nanowires in the form of gold-silver-gold (or gold-nickel-gold) were prepared and randomly scattered on a substrate, and gold/titanium or silica ($SiO_2$) was then deposited thereon. The gold-silver-gold (or gold-nickel-gold) nanowires were detached from the substrate through sonication and only silver (or nickel) was then selectively etched from the gold-silver-gold (or gold-nickel-gold) nanowires to form a nanospacing at a position in which silver (or nickel) existed between gold layers. Since a nanospacing having a minimum size of 5 nm may be formed in a nanowire electrode prepared through the above method, a nanoscale device having high resolution may be fabricated.

However, the foregoing process may have the following limitations; (1) Since nanowires are randomly scattered in the above process, positions and directions of nanospacings may not be accurately controlled. Since the positions and directions of the nanospacings must be controlled in order to regularly arrange nanoscale devices, the above process may not be used for integrating the nanoscale devices. (2) In order to fabricate a device by using a metal nanowire prepared by the above process, probing electrodes must be accurately deposited on both ends of the metal nanowire. Since a high cost E-beam lithography technique must be used for this purpose, the above process may not be suitable for large area or mass production. (3) The above process has poor reproducibility and thus, may be difficult to be used for a real device.

Coli at Nokia Research Center, and Ferrari and his colleagues at University of Cambridge scattered inorganic nanowires on a silicon substrate and used them as an etching mask (see A. Colli, A. Fasoli, S. Pisana, Y. Fu, P. Beecher, W. I. Miline, A. C. Ferrari, *Nano Letters,* 8, 1358-1362. (2008)). However, since nanowires are also randomly scattered on a substrate in this process, this process may have three limitations described above.

Therefore, there is a need to develop a method of forming a micropattern, which overcomes limitations in alignment, reproducibility, and large area or mass production described above.

DETAILED DESCRIPTION OF THE INVENTION

Technical Problem

The present invention provides a method of forming a micropattern able to accurately control a position and a direction of the pattern, and form the pattern over a large area, and a method of forming an electronic device using the same.

Technical Solution

According to an aspect of the present invention, there is provided a method of forming a micropattern including: forming an organic wire or organic-inorganic hybrid wire mask pattern having a circular or elliptical cross section on a substrate; forming a material layer on an entire surface of the substrate having the organic wire or organic-inorganic hybrid wire mask pattern formed thereon; and removing the organic wire or organic-inorganic hybrid wire mask pattern from the substrate to allow only the material layer on a portion of the substrate having no organic wire or organic-inorganic hybrid wire mask pattern formed thereon to be remained.

The organic wire or organic-inorganic hybrid wire mask pattern having a circular or elliptical cross section may be prepared by electric field auxiliary robotic nozzle printing, direct tip drawing, meniscus-guided direct writing, melt spinning, wet spinning, dry spinning, gel spinning, or electrospinning.

An electric field auxiliary robotic nozzle printer used in the electric field auxiliary robotic nozzle printing may include a solution storage apparatus supplying a solution for discharge, a nozzle discharging the solution supplied from the solution storage apparatus, a voltage applying apparatus applying high voltage to the nozzle, a flat and movable collector on which an organic wire or an organic-inorganic hybrid wire formed by being discharged from the nozzle is aligned, a robot stage installed under the collector to move the collector in x-y directions (horizontal direction), a micro distance controller controlling a distance between the nozzle and the collector in a z direction (vertical direction), and a base plate disposed under the robot stage to maintain flatness of the collector and inhibit vibration generated during operation of the robot stage.

The forming of the organic wire or organic-inorganic hybrid wire mask pattern through the electric field auxiliary robotic nozzle printing may include: mixing an organic or organic-inorganic hybrid material with distilled water or an organic solvent to prepare an organic solution; putting the organic solution in the solution storage apparatus of the electric field auxiliary robotic nozzle printer; discharging the organic solution in the solution storage apparatus from the nozzle while applying high voltage to the nozzle through the voltage applying apparatus of the electric field auxiliary robotic nozzle printer; and aligning an organic wire or an organic-inorganic hybrid wire formed from the organic solution discharged from the nozzle on the substrate on the collector while moving the collector.

According to another aspect of the present invention, there is provided a method of forming a micropattern including: forming a pattern forming layer on a substrate; forming an organic wire or organic-inorganic hybrid wire etching mask pattern having a circular or elliptical cross section on a substrate; etching the pattern forming layer by using the organic wire or organic-inorganic hybrid wire etching mask pattern as an etching mask; and selectively removing the organic wire or organic-inorganic hybrid wire etching mask pattern from the substrate.

The organic wire or organic-inorganic hybrid wire etching mask pattern having a circular or elliptical cross section may be prepared by electric field auxiliary robotic nozzle printing, direct tip drawing, meniscus-guided direct writing, melt spinning, wet spinning, dry spinning, gel spinning, or electrospinning.

According to another aspect of the present invention, there is provided a method of forming a microchannel transistor having a bottom-gate structure including: forming a gate electrode on a substrate; forming a gate dielectric layer on the gate electrode; forming an organic wire or organic-inorganic hybrid wire mask pattern having a circular or elliptical cross section on the gate dielectric layer; forming a material layer for source electrode and drain electrode on the gate dielectric layer and the organic wire or organic-inorganic hybrid wire mask pattern; forming a source electrode and a drain electrode by lifting off the organic wire or organic-inorganic hybrid wire mask pattern from the substrate; and forming an active layer on the source electrode and the drain electrode.

According to another aspect of the present invention, there is provided a method of forming a microchannel transistor having a top-gate structure including: forming an organic wire or organic-inorganic hybrid wire mask pattern having a circular or elliptical cross section on a substrate; forming a material layer for source electrode and drain electrode on the organic wire or organic-inorganic hybrid wire mask pattern; forming a source electrode and a drain electrode by lifting off the organic wire or organic-inorganic hybrid wire mask pattern from the substrate; forming an active layer on the source electrode and the drain electrode; forming a gate dielectric layer on the active layer; and forming a gate electrode on the gate dielectric layer.

The organic wire or organic-inorganic hybrid wire mask pattern having a circular or elliptical cross section may be prepared by electric field auxiliary robotic nozzle printing, direct tip drawing, meniscus-guided direct writing, melt spinning, wet spinning, dry spinning, gel spinning, or electrospinning.

The active layer may be formed by thermal evaporation, E-beam evaporation, atomic layer deposition, chemical vapor deposition, spin coating, dip coating, drop casting, or sputtering. Also, the active layer may be formed in a shape of an organic wire by using an electric field auxiliary robotic nozzle printer.

According to another aspect of the present invention, there is provided a method of forming a microchannel light-emitting transistor having a bottom-gate structure including: forming a gate electrode on a substrate; forming a gate dielectric layer on the gate electrode; forming an organic wire or organic-inorganic hybrid wire mask pattern having a circular or elliptical cross section on the gate dielectric layer; forming a material layer for source electrode and drain electrode on the gate dielectric layer and the organic wire or organic-inorganic hybrid wire mask pattern; forming a source electrode and a drain electrode by lifting off the organic wire or organic-inorganic hybrid wire mask pattern from the substrate; and forming a light-emitting active layer on the source electrode and the drain electrode.

According to another aspect of the present invention, there is provided a method of forming a microchannel light-emitting transistor having a top-gate structure including: forming an organic wire or organic-inorganic hybrid wire mask pattern having a circular or elliptical cross section on a substrate; forming a material layer for source electrode and drain electrode on the organic wire or organic-inorganic hybrid wire mask pattern; forming a source electrode and a drain electrode by lifting off the organic wire or organic-inorganic hybrid wire mask pattern from the substrate; forming a light-emitting active layer on the source electrode and the drain electrode; forming a gate dielectric layer on the light-emitting active layer; and forming a gate electrode on the gate dielectric layer.

The organic wire or organic-inorganic hybrid wire mask pattern having a circular or elliptical cross section may be prepared by electric field auxiliary robotic nozzle printing, direct tip drawing, meniscus-guided direct writing, melt spinning, wet spinning, dry spinning, gel spinning, or electrospinning.

The light-emitting active layer may include a particle, a quantum dot, a rod, a wire, or a thin film of an inorganic light-emitting semiconductor selected from the group consisting of GaAs, AlGaAs, GaP, AlGaP, InGaP, GaN, INGaN, ZnSe, CdSe, CdTe, and CdS, an organic light-emitting polymer semiconductor material selected from the group consisting of poly(9-vinylcarbazole) or a derivative thereof, poly(9, 9'-dioctylfluorene-co-bithiophene) (F8T2) or a derivative thereof, poly(9,9'-dioctylfluorene-co-benzothiadiazole) (F8BT) or a derivative thereof, poly(p-phenylenevinylene) or a derivative thereof, poly(p-phenylene) or a derivative thereof, polyaniline or a derivative thereof, polythiophene or a derivative thereof, polypyrrole or a derivative thereof, polyfluorene or a derivative thereof, and poly(spiro-fluorene) or a derivative thereof, an organic light-emitting low molecular weight semiconductor material selected from the group consisting of tetracene, rubrene, α,ω-Bis(biphenylyl)terthiophene (BP3T), α-quinquethiophene (α-5T), α-sexithiophene (α-6T), and N,N'-ditridecylperylene-3,4,9,10-tetracarboxylic diimide (P13), or a blend thereof. Since all fluorescent materials, phosphorescent materials, or combinations thereof may be included in the present invention, the light-emitting active layer is not particularly limited to a particular light-emitting material.

The light-emitting active layer may further include an ionic dopant facilitating injection of holes and electrons. The ionic dopant may include tetrapropylammonium tetrafluoroborate (TPABF$_4$), tetrabutylammonium tetrafluoroborate (TBABF$_4$), lithium trifluoromethanesulfonate (LiOTf), potassium trifluoromethanesulfonate (KTf), and sodium trifluoromethanesulfonate (NaTf).

The light-emitting active layer may be formed by thermal evaporation, E-beam evaporation, atomic layer deposition, chemical vapor deposition, spin coating, dip coating, drop casting, or sputtering.

The light-emitting active layer may be formed in a shape of an organic wire by using an electric field auxiliary robotic nozzle printer.

Advantageous Effects

A method of forming a pattern having a microspacing according to an aspect of the present invention may accurately form a pattern having a microspacing over a large area and at a desired position by forming an organic wire or organic-inorganic hybrid wire mask pattern having a circular or elliptical cross section and forming a material layer thereon, and then removing the organic wire or organic-inorganic hybrid wire mask pattern. Since the formation of the organic wire or organic-inorganic hybrid wire mask pattern may be performed at room temperature and atmospheric pressure, the method may replace a typical high cost method of forming a micropattern, such as photolithography and E-beam lithography.

A method of forming a microchannel transistor according to another aspect of the present invention may fabricate a high-performance transistor device having a microchannel by forming source and drain electrodes having a microspacing through the organic wire or organic-inorganic hybrid wire mask pattern.

Also, a method of forming a microchannel light-emitting transistor according to another aspect of the present invention may fabricate a light-emitting transistor having high luminous efficiency by forming source and drain electrodes having a microspacing through the organic wire or organic-inorganic hybrid wire mask pattern to facilitate injection of holes and electrons into an active layer through the source and drain electrodes.

BEST MODE

Figure 1:
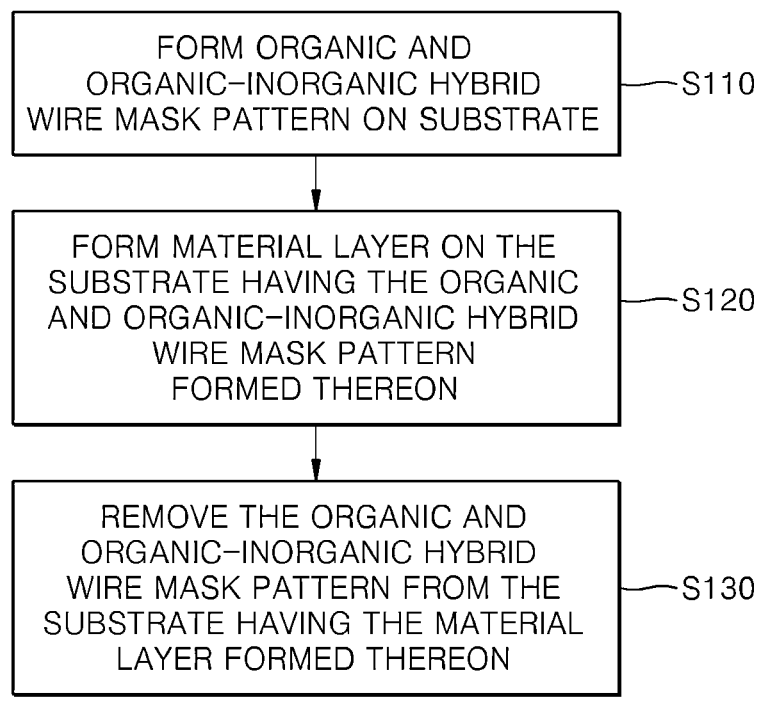
FIG. 1 is a flowchart sequentially illustrating a method of forming a micropattern according to an embodiment of the present invention.

Hereinafter, the present invention will be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals refer to like elements throughout.

In the present specification, the term "organic-inorganic hybrid" denotes that an organic material and an inorganic material are mixed.

FIG. 1 is a flowchart sequentially illustrating a method of forming a micropattern according to an embodiment of the present invention.

Referring to FIG. 1, an organic wire or organic-inorganic hybrid wire mask pattern is first formed on a substrate (S110). The organic wire or organic-inorganic hybrid wire mask pattern may be formed to have a uniform diameter. For example, the organic wire or organic-inorganic hybrid wire mask pattern may be formed to have a diameter ranging from about 10 nm to about 100 μm.

The organic wire or organic-inorganic hybrid wire mask pattern may be formed by being selected among a random oriented pattern and an aligned pattern. In the aligned pattern of organic wires or organic-inorganic hybrid wires, an angle between two or more parallel wires has a tolerance ranging from 0 degrees to 10 degrees. Also, the aligned pattern has a straightness ranging from 0% to 10% with respect to a direction of printing each wire. Further, the aligned pattern of the organic wires or the organic-inorganic hybrid wires may be formed to have a uniform spacing. For example, the aligned pattern of the organic wires or the organic-inorganic hybrid wires may be formed to have a spacing ranging from about 10 nm to about 100 cm. Meanwhile, patterns not satisfying the above conditions are denoted as random oriented patterns. The random oriented patterns may have a combination of various shapes, such as circular, elliptical, curved, linear, and bent shapes.

The organic wire or organic-inorganic hybrid wire mask pattern may be formed to have a circular or elliptical cross section. In the case that the cross section of the organic wire or organic-inorganic hybrid wire mask pattern is not circular or elliptical, a material layer on the mask pattern and a material layer on a portion having no mask pattern formed thereon are formed in a continuous shape when the material layer is formed on the mask pattern. At this time, when the mask pattern is removed, a portion of the material layer near the mask pattern among the material layer on the portion having no mask pattern formed thereon is removed with the material layer on the mask pattern, and thus, an accurate micro pattern may not be formed. Also, in the case that the cross section of the mask pattern is not circular or elliptical, since a contact area between the mask pattern and the substrate increases, the mask pattern may not be properly removed. Therefore, an organic wire or organic-inorganic hybrid wire mask pattern having a circular or elliptical cross section may be used.

The organic wire or organic-inorganic hybrid wire mask pattern having a circular or elliptical cross section may be prepared by electric field aided robotic nozzle printing, direct tip drawing (see J. Shi, M. Guo, B. Li, Appl. Phys. Lett., 93, 121101 (2008)), meniscus-guided direct writing (see J. T. Kim, S. K. Seol, J. Pyo, J. S. Lee, J. H. Je, G. Margaritondo, Adv. Mater. 23, 1968-1970 (2011)), melt spinning (see S. Kase, T. Matsuo, J. Polymer Sci. Part A, 3, 2541-2554 (1965)), wet spinning (see G. C. East, Y. Qin, J. Appl. Polymer Sci. 50, 1773-1779 (1993)), dry spinning (see S. Gogolewski, A. J. Pennings, Polymer, 26, 1394-1400 (1985)), gel spinning (see R. Fukae, A. Maekawa, O. Sangen, Polymer, 46, 11193-11194 (2005)), or electrospinning (see V. Thavasi, G. Singh, S. Ramakrishna, Energy Environ. Sci. 1, 205-221 (2008)). However, the present invention is not limited thereto.

Continuously, a material layer to be formed as a pattern is formed on an entire surface of the substrate having the organic wire or organic-inorganic hybrid wire mask pattern formed thereon (S120). The material layer, for example, may be formed of metal, a semiconductor inorganic material, a conductive inorganic material, an insulating inorganic material, an organic polymer semiconductor, an organic low molecular weight semiconductor, an organic conductive polymer, an organic insulating polymer, or a blend thereof.

Subsequently, the organic wire or organic-inorganic hybrid wire mask pattern is removed from the substrate having the material layer formed thereon (S130). Then, a portion of the material layer on the organic wire or organic-inorganic hybrid wire is also lifted off together to thus form a pattern having a microspacing which corresponds to a diameter of the organic wire or the organic-inorganic hybrid wire.

Figure 2A:
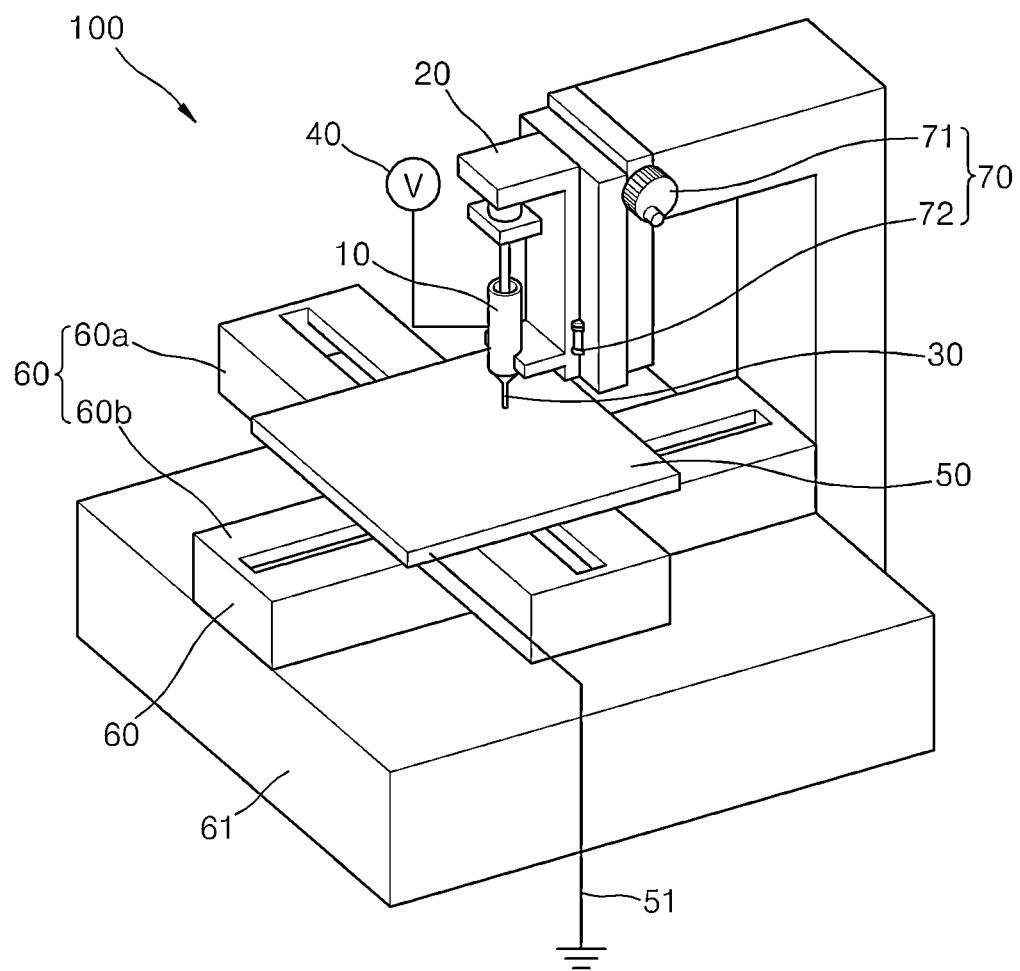
FIGS. 2a and 2b are schematic perspective and side views of an electric field auxiliary robotic nozzle printer 100 used in forming an organic wire or organic-inorganic hybrid wire mask by electric field auxiliary robotic nozzle printing during the formation of a micropattern according to an embodiment of the present invention, respectively.
Figure 2B:
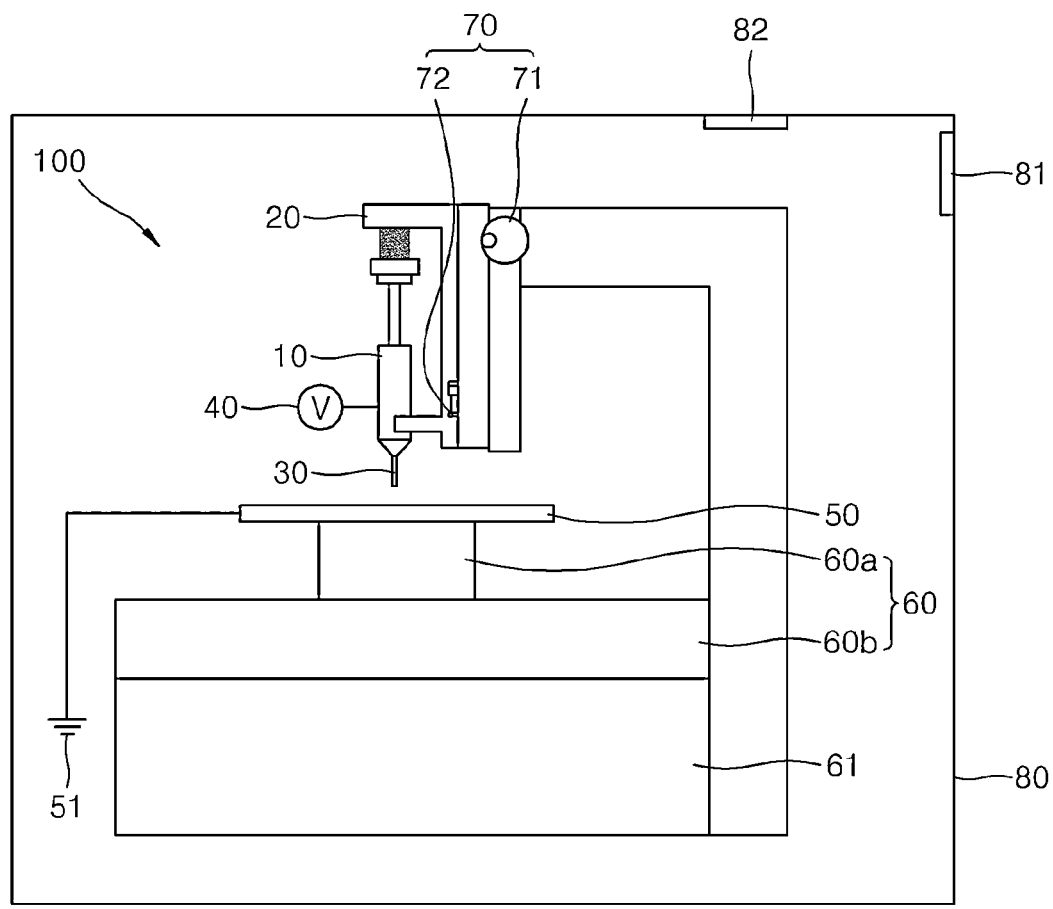

FIGS. 2a and 2b are schematic perspective and side views of an electric field aided robotic nozzle printer 100 used in forming an organic wire or organic-inorganic hybrid wire mask by electric field aided robotic nozzle printing during the formation of a micropattern according to an embodiment of the present invention, respectively.

Referring to FIGS. 2a and 2b, the electric field aided robotic nozzle printer 100 according to the present invention includes a solution storage apparatus 10, a discharge controller 20, a nozzle 30, a voltage applying apparatus 40, a collector 50, a robot stage 60, a base plate 61, and a micro distance controller 70.

The solution storage apparatus 10 is a part containing an organic solution and supplying the organic solution to the nozzle 30 so as to allow the nozzle 30 to be able to discharge the organic solution. The solution storage apparatus 10 may have a syringe shape. The solution storage apparatus 10 may be formed of plastic, glass, or stainless steel, but the present invention is not limited thereto. A storage capacity of the solution storage apparatus 10 may be selected from within a range of about 1 µl to about 5,000 ml, but the storage capacity thereof is not limited thereto. For example, the storage capacity of the solution storage apparatus 10 may be selected from within a range of about 10 µl to about 50 ml. With respect to the solution storage apparatus 10 formed of stainless steel, a gas inlet (not shown) able to inject gas into the solution storage apparatus 10 is provided and thus, the organic solution may be injected to the outside of the solution storage apparatus by using gas pressure. Meanwhile, the plurality of solution storage apparatus 10 may be used in order to form an organic wire or an organic-inorganic hybrid wire having a core-shell structure.

The discharge controller 20 is a part applying pressure to the organic solution in the solution storage apparatus 10 in order to discharge the organic solution in the solution storage apparatus 10 at a predetermined speed through the nozzle 30. A pump or gas pressure regulator may be used as the discharge controller 20. The discharge controller 20 may control a discharge speed of the organic solution to be in a range of 1 nl/min to 50 ml/min. In the case that the plurality of solution storage apparatus 10 is used, the plurality of solution storage apparatus 10 may be independently operated by including a separate discharge controller 20 to each solution storage apparatus 10. With respect to the solution storage apparatus 10 formed of stainless steel, a gas pressure regulator (not shown) may be used as the discharge controller 20.

The nozzle 30 is a part that discharges the organic solution by having the organic solution supplied form the solution storage apparatus 10 and the discharged organic solution may form a drop at an end of the nozzle 30. A diameter of the nozzle 30 may be in a range of about 100 nm to about 1.5 mm, but the diameter thereof is not limited thereto.

The nozzle 30 may include a single nozzle, a dual-concentric nozzle, and a triple-concentric nozzle. In the case that an organic wire or an organic-inorganic hybrid wire having a core-shell structure is formed, two or more types of organic solutions may be discharged by using a dual-concentric nozzle or a triple-concentric nozzle. In this case, two or three solution storage apparatuss 10 may be connected to the dual-concentric nozzle or the triple-concentric nozzle.

The voltage applying apparatus 40 is for applying high voltage to the nozzle 30 and may include a high voltage generating device. The voltage applying apparatus 40, for example, may be electrically connected to the nozzle 30 through the solution storage apparatus 10. The voltage applying apparatus 40 may apply a voltage ranging from about 0.1 kV to about 50 kV, but the present invention is not limited thereto. An electric field may exist between the grounded collector 50 and the nozzle 30 having a high voltage applied thereto by the voltage applying apparatus 40, a drop formed at the end of the nozzle 30 may form a Taylor cone by the electric field, and an organic wire or an organic-inorganic hybrid wire is continuously formed at the end thereof.

The collector 50 is a part to which the organic wire or the organic-inorganic hybrid wire formed from the organic solution discharged from the nozzle 30 is aligned and attached. The collector 50 has a flat shape and is movable on a horizontal plane by the robot stage 60 thereunder. The collector 50 is relatively grounded with respect to the high voltage applied to the nozzle 30. Reference number 51 denotes that the collector 50 is grounded. The collector 50 may be formed of a conductive material, for example, metal and may have a flatness ranging from 0.5 µm to 10 µm (Flatness denotes a maximum error value of an actual plane from a perfect horizontal plane when the flatness of the perfect horizontal plane is zero. For example, flatness of a plane is a distance between the lowest point and the highest point of the plane.).

The robot stage 60 is a device moving the collector 50. The robot stage 60 is driven by a servo motor and may move at a precise speed. The robot stage 60, for example, may be controlled to be moved in two directions of an x-axis and a y-axis on a horizontal plane. The robot stage 60, for example, may be composed of an x-axis robot stage 60a moving in an x-axis direction and a y-axis robot stage 60b moving in a y-axis direction. A movable distance of the robot stage 60 is in a range of 10 nm or more to 100 cm or less, but the present invention is not limited thereto. The movable distance of the robot stage 60 may be in a range of 10 μm or more to 20 cm or less. A movement speed of the robot stage 60 may be controlled within a range of 1 mm/min to 60,000 mm/min, but the movement speed thereof is not limited thereto. The robot stage 60 may be installed on the base plate 61 and the base plate 61 may have a flatness ranging from 0.1 μm to 5 μm. A distance between the nozzle 30 and the collector 50 may be constantly adjusted by the flatness of the base plate 61. That is, since the flatness of the base plate 61 is high, the distance between the nozzle 30 and the collector 50 disposed on the robot stage 60 moving on the base plate 61 may be constantly adjusted. Also, the base plate 61 may inhibit vibration generated by the operation of the robot stage 60 and thus, precision of the organic wire or organic-inorganic hybrid wire pattern may be controlled.

The micro distance controller 70 may be composed of a jog 71 and a micrometer 72. The jog 71 may be used to roughly adjust a distance in "mm" unit or "cm" unit, and the micrometer 72 may be used to adjust a micro distance of a minimum of 10 μm. The nozzle 30 is moved near the collector 50 with the jog 71 and the distance between the nozzle 30 and the collector 50 may then be precisely adjusted with the micrometer 72. The distance between the nozzle 30 and the collector 50 may be adjusted within a range of 10 μm to 20 mm by using the micro distance controller 70. For example, the collector 50 parallel to an x-y plane may be moved on the x-y plane by using the robot stage 60 and the distance between the nozzle 30 and the collector 50 may be adjusted in a z-axis direction by using the micro distance controller 70.

A paper of D. H. Reneker, A. L. Yarin, H. Fong, S. Koombhongse, "Bending instability of electrically charged liquid jets of polymer solutions in electrospinning" J. Appl. Phys., 87, 9, 4531-4546 (2000), in which a three-dimensional path of nanofibers spun from a nozzle in electrospinning is calculated, discloses that the greater a distance between a collector and a nozzle is, the higher the perturbation becomes. According to the above paper, $$x = 10^{-3} L \cos\left(\frac{2\pi}{\lambda} z\right) \frac{h-z}{h} \quad \text{Equation 1a}$$

$$y = 10^{-3} L \sin\left(\frac{2\pi}{\lambda} z\right) \frac{h-z}{h}. \quad \text{Equation 1b}$$

where x and y are respectively positions in x-axis and y-axis directions on a plane parallel to the collector, λ is a perturbation wavelength, z is a vertical position of an organic wire or an organic-inorganic hybrid wire with respect to the collector (z=0), and h is the distance between the nozzle and the collector. From Equations 1a and 1b, it may be understood that the greater the distance h between the nozzle and the collector is, the greater the values of x and y representing the perturbation of the organic wire or the organic-inorganic hybrid wire are.

Actually, the organic wire or the organic-inorganic hybrid wire generated from a drop at the end of the nozzle and elongated outwardly has almost a linear shape in the z direction vertical to the collector near the nozzle, in which the wire is generated. However, lateral velocity of the organic wire or the organic-inorganic hybrid wire increases as the wire moves away from the nozzle and thus, the wire may be bent.

The electric field aided robotic nozzle printer 100 used in embodiments of the present invention may sufficiently decrease the distance between the nozzle 30 and the collector 50 to 10 micrometers to a few tens of micrometers, and thus, may allow the wire to be dropped straight on the collector 50 before the perturbation of the nanowire. Therefore, an organic wire or organic-inorganic hybrid wire pattern may be formed by the movement of the collector 50.

The formation of the organic wire or organic-inorganic hybrid wire pattern by the movement of the collector may allow a more precise organic wire or organic-inorganic hybrid wire pattern to be formed by reducing a perturbation variable of the organic wire or organic-inorganic hybrid wire pattern in comparison to the movement of the nozzle.

Meanwhile, the electric field aided robotic nozzle printer 100 may be put in a housing 80. The housing 80 may be formed of a transparent material. The housing 80 may be sealed and gas may be injected into the housing 80 through a gas inlet (not shown). The injected gas may be nitrogen or dried air, and an organic solution easily oxidized by moisture may be stably maintained by the injection of the gas. Also, a ventilator 81 and a lamp 82 may be installed in the housing 80. The ventilator 81 and the lamp 82 may be installed at appropriate positions. The ventilator 81 may control an evaporation rate of a solvent during the formation of the organic wire or the organic-inorganic hybrid wire by controlling vapor pressure (generated from the solvent) in the housing 80. In robotic nozzle printing requiring fast evaporation of the solvent, the evaporation of the solvent may be assisted by controlling the speed of the ventilator 81. The evaporation rate of the solvent may affect shape and electrical properties of the organic wire or the organic-inorganic hybrid wire. In the case that the evaporation rate of the solvent is relatively high, the solution dries at the end of the nozzle before the formation of the organic wire or the organic-inorganic hybrid wire, and thus, the nozzle may be clogged. In the case that the evaporation rate of the solvent is relatively low, a solid organic wire or a solid organic-inorganic hybrid wire is not formed, and an organic wire or an organic-inorganic hybrid wire in a liquid state may be disposed on the collector. Since a line of the organic solution in a liquid state has poor electrical properties, the line thereof may not be used for fabricating a device. Thus, since the evaporation rate of the solvent affects the formation and properties of the organic wire or the organic-inorganic hybrid wire, the ventilator 81 may play an important role in forming the organic wire or the organic-inorganic hybrid wire.

Figure 3A:
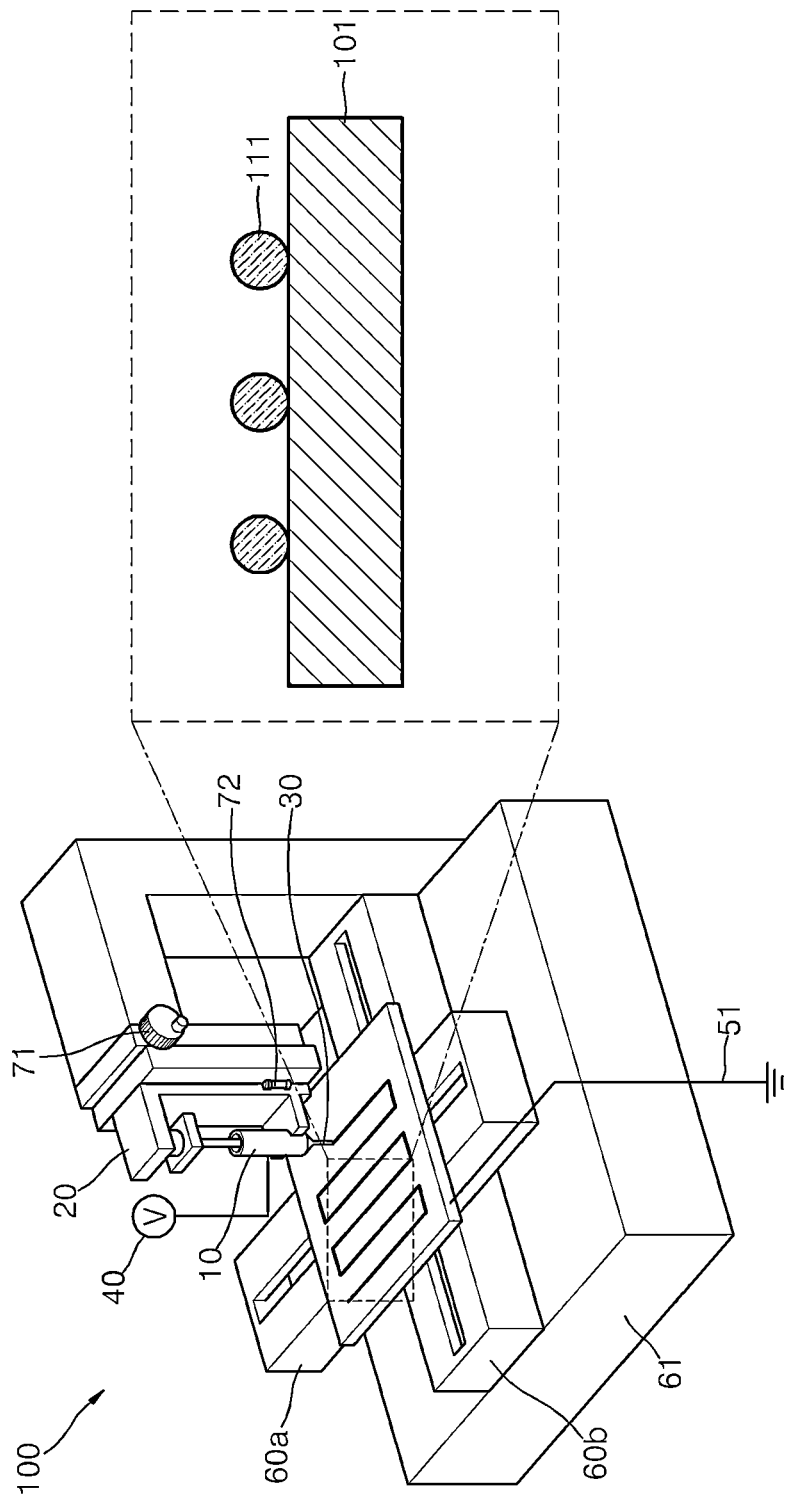
FIGS. 3a through 3c are cross-sectional views sequentially illustrating a method of forming a pattern having a microspacing according to an embodiment of the present invention.
Figure 3B:
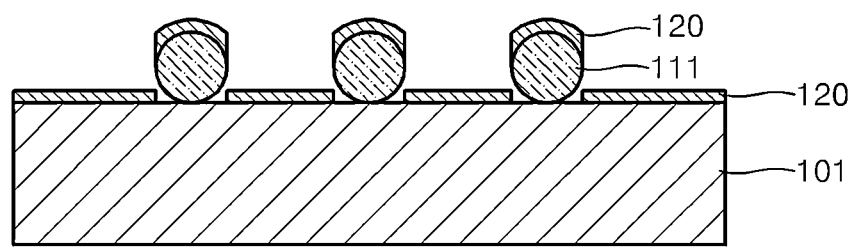
Figure 3C:
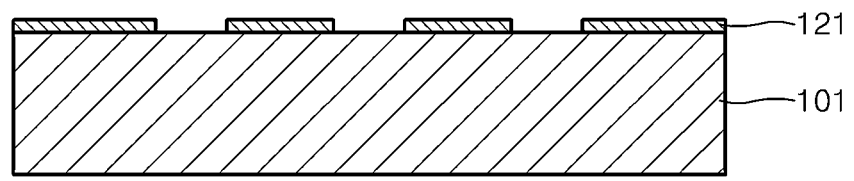
Figure 4A:
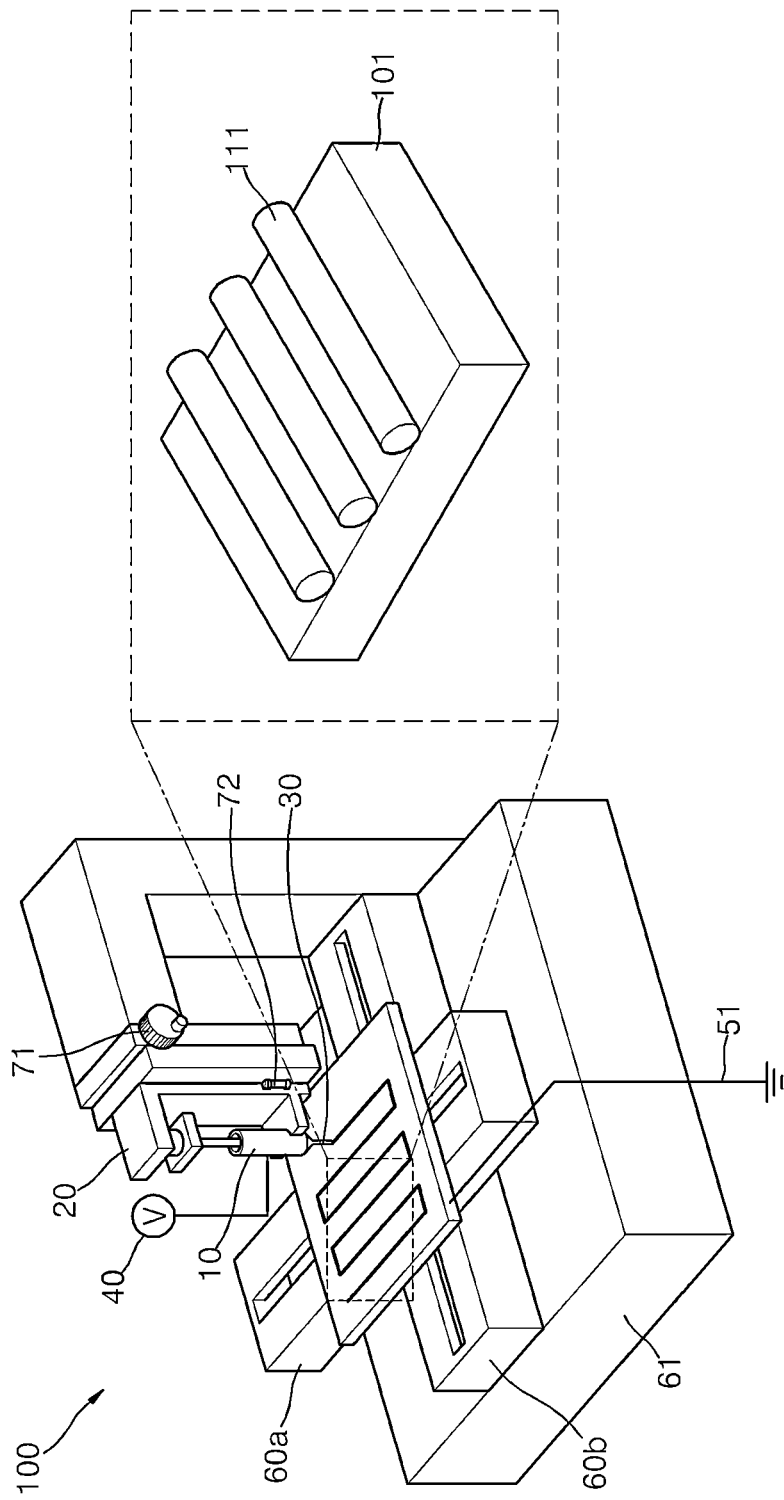
FIGS. 4a through 4c are perspective views corresponding to FIGS. 3a through 3c.
Figure 4B:
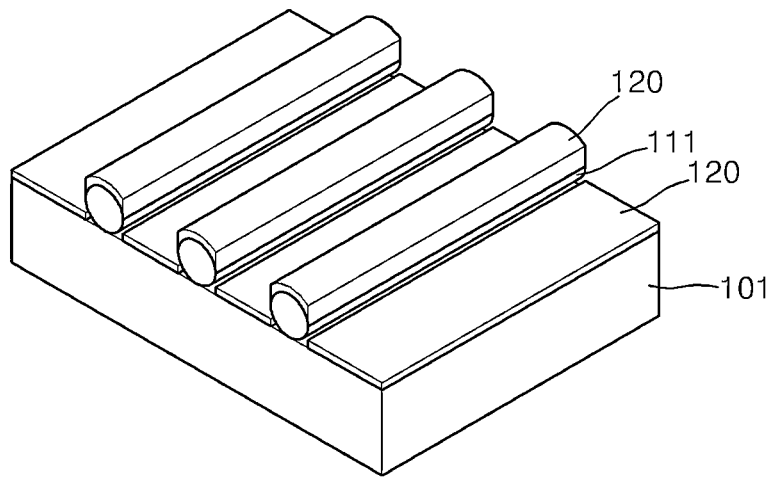
Figure 4C:
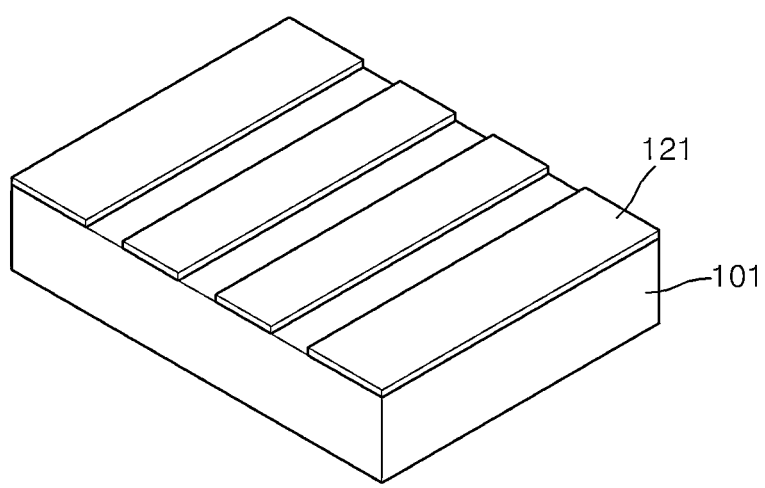

FIGS. 3a through 3c are cross-sectional views sequentially illustrating a method of forming a pattern having a microspacing according to an embodiment of the present invention, and FIGS. 4a through 4c are perspective views corresponding to FIGS. 3a through 3c. The electric filed aided robotic nozzle printer 100 used in forming an organic wire or organic-inorganic hybrid wire mask pattern 111 is also illustrated in FIGS. 3a and 4a. However, a method of forming the organic wire or organic-inorganic hybrid wire mask pattern 111 is not limited to a method of using an electric filed aided robotic nozzle printer.

Referring to FIGS. 3a and 4a, the organic wire or organic-inorganic hybrid wire mask pattern 111 is formed on a substrate 101 by using the electric filed aided robotic nozzle printer 100 described in FIGS. 2a and 2b.

The substrate 101 may be formed of a conductor material, such as aluminum, copper, nickel, iron, chromium, titanium, zinc, lead, gold, and silver, a semiconductor material, such as silicon (Si), germanium (Ge), and gallium arsenide (GaAs), and an insulation material, such as glass, a plastic film, and paper, but the present invention is not limited thereto. A thickness of the substrate 101 may be in a range of 50 µm to 50 mm, but the thickness thereof is not limited thereto.

A process of forming the organic wire or organic-inorganic hybrid wire mask pattern 111 by using the electric filed aided robotic nozzle printer 100 is described below. First, an organic material is mixed with distilled water or an organic solvent to prepare an organic solution. An organic low molecular weight semiconductor, an organic polymer semiconductor, a conductive polymer, an insulating polymer, or a blend thereof may be used as the organic material, but the organic material is not limited thereto. Examples of the organic low molecular weight semiconductor material may be 6,13-bis(triisopropylsilylethynyl pentacene), triethylsilylethynyl anthradithiophene (TES ADT), or [6,6]-phenyl C61 butyric acid methyl ester (PCBM), but the organic low molecular weight semiconductor material is not limited thereto. Examples of the organic polymer semiconductor or the conductive polymer material may be a polythiophene derivative including poly(3-hexylthiophene) (P3HT) or poly (3,4-ethylenedioxythiophene) (PEDOT), poly(9-vinylcarbazole) (PVK) or a derivative thereof, poly(p-phenylene vinylene) or a derivative thereof, polyfluorene or a derivative thereof, polyaniline or a derivative thereof, or polypyrrole or a derivative thereof, but the organic polymer semiconductor or the conductive polymer material is not limited thereto. The insulating polymer material may include polyethylene oxide (PEO), polystyrene (PS), polycaprolactone (PCL), polyacrylonitrile (PAN), poly(methyl methacrylate) (PMMA), polyimide, poly(vinylidene fluoride) (PVDF), or polyvinylchloride (PVC), but the insulating polymer material is not limited thereto.

A material, in which an inorganic material is included in an organic material, is referred to as an "organic-inorganic hybrid material". In the case of forming an organic-inorganic hybrid wire, an inorganic material, such as a semiconductor having a shape of nano-sized particle, wire, ribbon, or rod, metal, metal oxide, a metal or metal oxide precursor, a carbon nanotube (CNT), reduced graphene oxide, graphene, a graphene quantum dot, a graphene nanoribbon, graphite, or a quantum dot having a core of a nano-sized semiconductor particle (CdSe, CdTe, CdS, etc.), may be included in the above organic materials. The organic solvent is a solvent that may dissolve the organic material and, for example, dichloroethylene, trichloroethylene, chloroform, chlorobenzene, dichlorobenzene, styrene, dimethylformamide, dimethyl sulfoxide, xylene, toluene, cyclohexene, isopropyl alcohol, ethanol, acetone, or a mixed solvent thereof may be used as the organic solvent. However, the organic solvent is not limited thereto.

Concentration and viscosity of the organic solution may be selected as concentration and viscosity suitable for being discharged from the nozzle 30 in consideration of a size of the nozzle 30 used in the electric filed aided robotic nozzle printer 100. A material for controlling the viscosity of the organic solution may be added. The material for controlling the viscosity, for example, may include PEO, PVK, PCL, or PS, but the material for controlling the viscosity is not limited thereto.

When the organic solution, in which the organic material is mixed with distilled water or the organic solvent, is contained in the solution storage apparatus 10 and then discharged from the nozzle 30 by the discharge controller 20, a drop is formed at the end of the nozzle 30. When a voltage ranging from 0.1 kV to 50 kV is applied to the nozzle 30 by using the voltage applying apparatus 40, the drop is adhered to the substrate 101 on the collector 50 while the drop is not dispersed but elongated in a direction of an electric field by electrostatic force between an electric charge formed in the drop and the grounded collector 50. Also, the substrate 101 may constitute the collector 50.

At this time, an organic wire or an organic-inorganic hybrid wire having a length in one direction longer than those in other directions may be formed from the drop as the drop is elongated. A diameter of the organic wire or the organic-inorganic hybrid wire may be controlled to be in a range of 10 nm to 100 µm according to the control of the applied voltage and the size of the nozzle. In the present specification, a wire having a diameter less than 1 µm is denoted as a nanowire and a wire having a diameter more than 1 µm is denoted as a microwire.

An organic wire or organic-inorganic hybrid wire mask pattern is formed by aligning the organic wire or the organic-inorganic hybrid wire formed of the charged discharge from the nozzle 30 on the substrate 101 on the collector 50. At this time, the organic wire or the organic-inorganic hybrid wire not having a tangled form but having a separated form may be formed on the substrate on the collector 50 by controlling the distance between the nozzle 30 and the collector 50 to be between 10 µm to 20 mm. At this time, the distance between the nozzle 30 and the collector 50 may be controlled by using the micro distance controller 70.

Also, a desired number of the organic wire or organic-inorganic hybrid wire mask patterns aligned in a desired direction may be formed at a desired position on the substrate 101 on the collector 50 by moving the collector 50. When the aligned organic wire or organic-inorganic hybrid wire is formed, the collector 50 is precisely moved within a range of 10 nm to 100 cm by the robot stage 60 driven by the servo motor, and thus, a width of the organic wire or organic-inorganic hybrid wire mask pattern and a width of a pattern having a microspacing may be adjusted within a range of 10 nm to 100 cm.

Meanwhile, the organic wire or the organic-inorganic hybrid wire may not only be formed in a linear shape, but may also be formed in various shapes by the movement of the collector 50. For example, a structure, such as a bent linear type, curved type, comb type, serpentine type, square type, rectangular type, rhombohedral type, triangular type, circular type, elliptical type, grid type, text type, or random mixed type thereof, may be included, but the present invention is not limited thereto.

Referring to FIGS. 3b and 4b, a material layer 120 to be formed as a pattern having a microspacing is formed on the substrate 101 having the organic wire or organic-inorganic hybrid wire mask pattern 111 formed thereon. At this time, the material layer 120, for example, may be deposited in a desired shape by using a shadow mask. The material layer 120 may be formed on the substrate 101 and the microwire mask pattern 111.

The material layer 120 may be formed of various materials according to the application of the pattern having a microspacing. For example, in the case that the pattern having a microspacing is used as an electrode, the material layer 120 may be formed of a conductive material. At this time, the material layer 120 may be formed of a conductive material, for example, gold, platinum, silver, nickel, copper, aluminum, titanium, cobalt, iron, tungsten, ruthenium, rhodium, palladium, molybdenum, cadmium, vanadium, chromium, zinc, indium, yttrium, lithium, tin, lead, or an alloy thereof, or p-doped or n-doped silicon, zinc oxide, indium oxide, indium tin oxide (ITO), or indium zinc oxide (IZO).

Also, an organic polymer semiconductor or an organic low molecular weight semiconductor, a conductive polymer, an insulating polymer, or a blend thereof may be used as the material layer 120. The organic polymer semiconductor or the conductive polymer material may be a polythiophene derivative including P3HT, poly 3-octylthiophene (P3OT), poly butylthiophene (PBT), PEDOT/polystyrenesulfonate (PSS), and poly(9,9'-dioctylfluorene-co-bithiophene) (F8T2), polyphenylenevinylene or a derivative thereof, poly (thienylene vinylene) (PTV) or a derivative thereof, polyacetylene or a derivative thereof, polyaniline or a derivative thereof, polypyrrole or a derivative thereof, or polyfluorene or a derivative thereof, but the organic polymer semiconductor or the conductive polymer material is not limited thereto. The organic low molecular weight semiconductor material may be triisopropylsilylethynyl (TIPS) pentacene, pentacene, tetracene, anthracene, rubrene, or alpha-hexathienylene ($\alpha$-6T), but the organic low molecular weight semiconductor material is not limited thereto. The insulating polymer material may include PEO, PS, PCL, PAN, PMMA, polyimide, PVDF, or PVC, but the insulating polymer material is not limited thereto. Further, the material layer 120 may be formed of an organic, inorganic, or metallic material in addition to the foregoing materials, and may be a semiconductor, conductive, or insulating material.

The material layer 120, for example, may be formed by using a method such as drop casting, spin-coating, E-beam evaporation, atomic layer deposition, chemical vapor deposition, thermal evaporation, or sputtering. Also, the material layer 120 may be formed to have a thickness ranging from 1 nm to 10 µm, but the thickness thereof is not limited thereto.

Referring to FIGS. 3c and 4c, the organic wire or organic-inorganic hybrid wire mask pattern 111 is removed from the substrate 101. The removal of the organic wire or organic-inorganic hybrid wire mask pattern 111 may be performed by a method of using adhesive force of an adhesive tape or a method of using decomposition caused by high-frequency sound waves in an organic solvent, but the present invention is not limited thereto.

In the method of using adhesive force of an adhesive tape, an adhesive tape is attached to a portion of the organic wire or organic-inorganic hybrid wire mask pattern 111 on which the material layer 120 is not formed and the organic wire or organic-inorganic hybrid wire mask pattern 111 may be detached by lifting off the adhesive tape. The material layer 120 deposited on the organic wire or organic-inorganic hybrid wire mask pattern 111 is also detached as the organic wire or organic-inorganic hybrid wire mask pattern 111 is detached from the substrate 101.

In the method of using decomposition caused by high-frequency sound waves in an organic solvent, the substrate 101 is put in an organic solvent for sonication which may selectively dissolve the organic wire or organic-inorganic hybrid wire mask pattern 111, and sonication is performed. At this time, dichloroethylene, trichloroethylene, chloroform, chlorobenzene, dichlorobenzene, styrene, dimethylformamide, dimethyl sulfoxide, xylene, toluene, cyclohexene, isopropyl alcohol, ethanol, acetone, or a mixed solvent thereof may be used as the organic solvent for sonication, but the organic solvent for sonication is not limited thereto. The material layer 120 formed on the organic wire or organic-inorganic hybrid wire mask pattern 111 is detached as the organic wire or organic-inorganic hybrid wire mask pattern 111 is selectively dissolved by the organic solvent.

A micropattern 121 having a spacing as large as the diameter of the organic wire or organic-inorganic hybrid wire mask pattern 111 is formed by selectively removing the material layer 120 on the organic wire or organic-inorganic hybrid wire mask pattern 111. Therefore, the microspacing of the micropattern 121 may be easily controlled by the diameter of the organic wire or organic-inorganic hybrid wire mask pattern 111.

Electrodes having a microspacing are formed on a transistor by the methods of forming a pattern according to embodiments of the present invention and a microchannel is formed in the microspacing, and thus, arrangement of transistors having a size of micrometer or less may be prepared in a large area. Also, since the electrodes may be formed of a conductive polymer, such as polythiophene, in addition to a metallic material, a transistor device having a size of micrometer or less may be fabricated, in which manufacturing costs thereof are relatively low and mobility is high.

FIGS. 5a through 5d are cross-sectional views illustrating a method of forming a microchannel transistor having a bottom-gate structure according to an embodiment of the present invention.

Figure 5A:
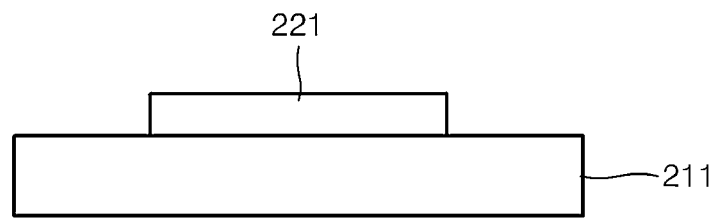
FIGS. 5a through 5d are cross-sectional views illustrating a method of forming a microchannel transistor having a bottom-gate structure according to an embodiment of the present invention.

Referring to FIG. 5a, a gate electrode 221 is formed on a substrate 211. The substrate 211 may be formed of a conductor material selected from the group consisting of aluminum, copper, nickel, iron, chromium, titanium, zinc, lead, gold, silver, and stainless steel, a semiconductor material selected from the group consisting of Si, Ge, and GaAs, and an insulation material selected from the group consisting of glass, a plastic film, and paper, but the present invention is not limited thereto. A buffer layer (not shown) may be formed on the substrate 211. The gate electrode 221, for example, may be formed of a conductive material selected form the group consisting of gold, platinum, silver, nickel, copper, aluminum, titanium, cobalt, iron, tungsten, ruthenium, rhodium, palladium, molybdenum, cadmium, vanadium, chromium, zinc, indium, yttrium, lithium, tin, lead, or an alloy thereof, or p-doped or n-doped silicon, zinc oxide, indium oxide, ITO, and IZO. However, the present invention is not limited thereto.

Figure 5B:
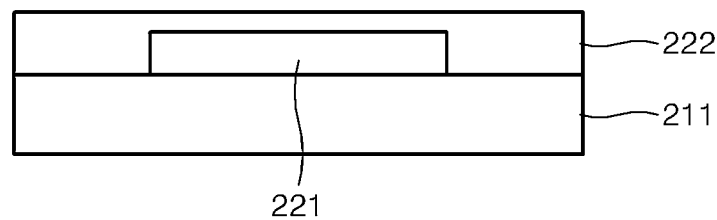

Referring to FIG. 5b, a gate dielectric layer 222 is formed on the gate electrode 221. The gate dielectric layer 222, for example, may be formed of an inorganic insulation layer such as a silicon oxide layer and an aluminum oxide layer, or an organic insulation layer such as an ion-gel polymer electrolyte.

Figure 5C:
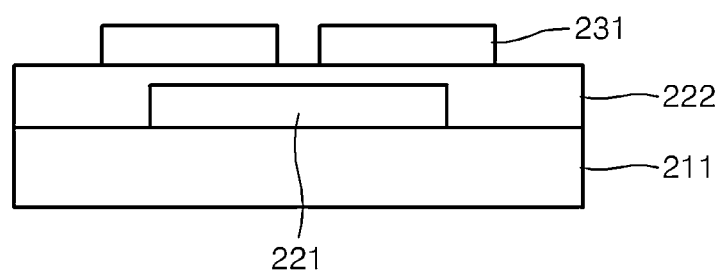

Referring to FIG. 5c, a source electrode and a drain electrode 231 having a microspacing is formed on the gate dielectric layer 222. The source electrode and the drain electrode 231 similar to the gate electrode 221 may be formed of a conductive material selected form the group consisting of gold, platinum, silver, nickel, copper, aluminum, titanium, cobalt, iron, tungsten, ruthenium, rhodium, palladium, molybdenum, cadmium, vanadium, chromium, zinc, indium, yttrium, lithium, tin, lead, or an alloy thereof, or p-doped or n-doped silicon, zinc oxide, indium oxide, ITO, and IZO. The source electrode and the drain electrode 231 having a microspacing may be formed by the foregoing method of forming a micropattern in relation to the embodiments of FIG. 2, FIGS. 3a through 3c, and FIGS. 4a through 4c. That is, the material layer on the organic wire or organic-inorganic hybrid wire mask pattern is formed of a material of the source electrode and the drain electrode 231, and the source electrode and the drain electrode 231 may be formed by removing the organic wire or organic-inorganic hybrid wire mask pattern. Also, electric field aided robotic nozzle printing, direct tip drawing, meniscus-guided direct writing, melt spinning, wet spinning, dry spinning, gel spinning, or electrospinning may be used in the formation of the organic wire or organic-inorganic hybrid wire mask pattern and the formation of the source and drain electrodes. However, the present invention is not limited thereto. The source electrode and the drain electrode 231 may be formed to a thickness ranging from 1 nm to 10 µm. A spacing between the source electrode and the drain electrode 231 may be in a range of 10 nm to 100 µm.

Figure 5D:
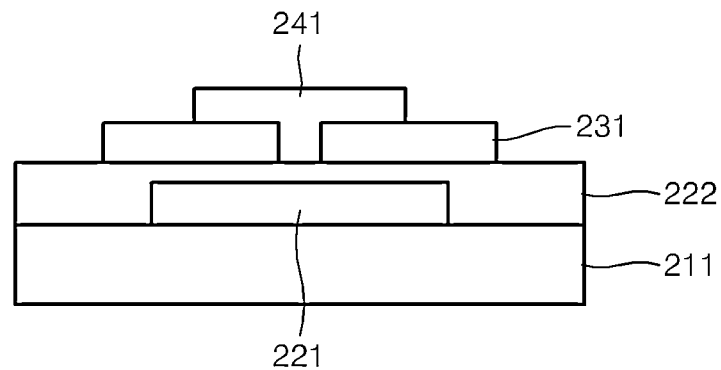
Figure 6A:
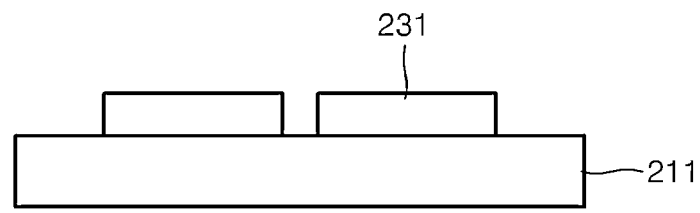
FIGS. 6a through 6d are cross-sectional views illustrating a method of forming a microchannel transistor having a top-gate structure according to an embodiment of the present invention.
Figure 6B:
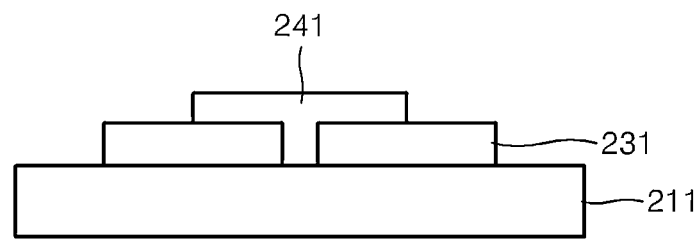
Figure 6C:
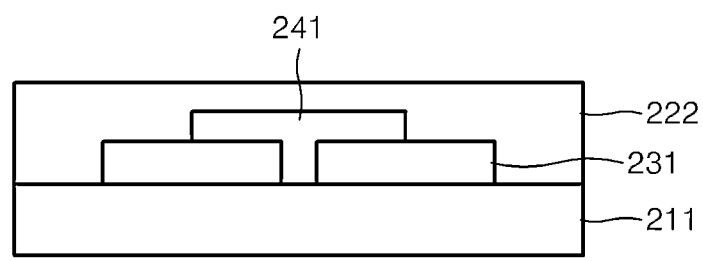
Figure 6D:
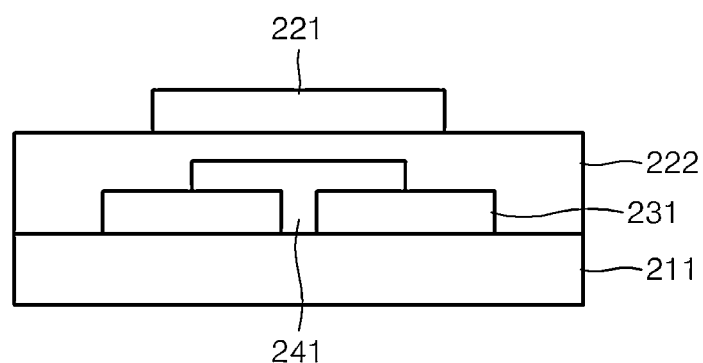

Referring to FIG. 5d, an active layer 241 forming a channel is formed on the source electrode and the drain electrode 231. The active layer 241 may be formed of an inorganic semiconductor material selected from the group consisting of silicon, germanium, and ZnO, a carbon material selected from the group consisting of CNT, fullerene, and graphene, an organic low molecular weight semiconductor material, and an organic polymer semiconductor material, but the present invention is not limited thereto.

Examples of the organic polymer semiconductor material may be a polythiophene derivative including P3HT, P3OT, and PBT, polypyrrole or a derivative thereof, or polyacetylene or a derivative thereof, but the organic polymer semiconductor material is not limited thereto.

Examples of the organic low molecular weight semiconductor material may be TIPS pentacene, pentacene, or anthracene, but the organic low molecular weight semiconductor material is not limited thereto.

In the case that the active layer 241 is formed by using a method such as thermal evaporation, E-beam evaporation, spin coating or dip coating, drop casting, and sputtering, a thin film microchannel may be formed between the source electrode and the drain electrode 231 having a microspacing.

Also, the active layer 241 may be formed by forming an organic wire channel (not shown) between the source electrode and the drain electrode 231 having a microchannel by using an electric field aided robotic nozzle printer. That is, the electric field aided robotic nozzle printer discharges the organic semiconductor material to deposit the organic semiconductor material in the shape of an organic wire on the substrate on the moving collector, and thus, an organic wire channel (not shown) may be formed.

FIGS. 6a through 6d are cross-sectional views illustrating a method of forming a microchannel transistor having a top-gate structure according to an embodiment of the present invention.

The method of forming a microchannel transistor having a top-gate structure according to the embodiment of FIGS. 6a through 6d is different from the method of forming a microchannel transistor having a bottom-gate structure according to the embodiment of FIGS. 5a through 5d in terms of the fact that a gate electrode 221 is formed on a source electrode and a drain electrode 231, and an active layer 241. That is, the source and the drain electrode 231 are first formed on a substrate 211 and the active layer 241 is formed on the source and the drain electrode 231, and a gate dielectric layer 222 is then formed and the gate electrode 221 is formed on the gate dielectric layer 222.

However, a method of forming the source and the drain electrode 231 and the active layer 241 is the same as the method of forming a microchannel transistor having a bottom-gate structure according to the embodiment of FIGS. 5a through 5d. That is, an organic wire or organic-inorganic hybrid wire mask pattern having a circular or elliptical cross section is formed on the substrate 211, a material layer for source electrode and drain electrode is formed on the organic wire or organic-inorganic hybrid wire mask pattern, and the source electrode and the drain electrode 231 are formed by lifting off the organic wire or organic-inorganic hybrid wire mask pattern from the substrate 211. Then, the active layer 241 is formed on the source electrode and the drain electrode 231.

A microchannel light-emitting transistor may be fabricated according to an embodiment of the present invention. The microchannel light-emitting transistor may be fabricated by selecting a light-emitting active layer as an active layer. The light-emitting transistor has a structure similar to that of a general microchannel transistor and has characteristics in which light is emitted from the light-emitting active layer by injection of holes and electrons respectively from source and drain electrodes. However, in the case that a microchannel is not included, since holes and electrons are not effectively injected, luminescence characteristics may not be appropriately obtained. A separate hole transport layer and an electron transport layer may be required in order to address the above limitations and thus, a structure of a device becomes complicated. Since a channel may be relatively small when a light-emitting transistor is fabricated by forming a microchannel, holes and electrons may be effectively injected, and thus, a high-performance light-emitting transistor having excellent light-emitting characteristics may be fabricated. The microchannel light-emitting transistor may also be fabricated in a bottom-gate structure or a top-gate structure.

The light-emitting active layer, for example, may include an inorganic light-emitting semiconductor in the form of a particle, a quantum dot, a rod, or a thin film selected from the group consisting of GaAs, AlGaAs, GaP, AlGaP, InGaP, GaN, INGaN, ZnSe, CdSe, CdTe, and CdS, an organic light-emitting polymer semiconductor material selected from the group consisting of poly(9-vinylcarbazole) or a derivative thereof, F8T2 or a derivative thereof, poly(9,9'-dioctylfluorene-co-benzothiadiazole) (F8BT) or a derivative thereof, poly(p-phenylenevinylene) or a derivative thereof, poly(p-phenylene) or a derivative thereof, polyaniline or a derivative thereof, polythiophene or a derivative thereof, polypyrrole or a derivative thereof, or polyfluorene or a derivative thereof, and poly(spiro-fluorene) or a derivative thereof, an organic light-emitting low molecular weight semiconductor material selected from the group consisting of tetracene, rubrene, α,ω-Bis(biphenylyl)terthiophene (BP3T), α-quinquethiophene (α-5T), α-6T, and N,N'-ditridecylperylene-3,4,9,10-tetracarboxylic diimide (P13), or a mixture thereof. Since all fluorescent materials, phosphorescent materials, or mixtures thereof may be included as a material of the light-emitting active layer in the present invention, the light-emitting active layer is not particularly limited to a particular light-emitting material. The light-emitting active layer may include the above materials in the form of a nano-sized particle, a quantum dot, or a rod.

The light-emitting active layer may further include an ionic dopant. The ionic dopant may further facilitate the injection and transfer of holes and electrons by forming a dipole moment in the light-emitting active layer.

The ionic dopant may be selected from the group consisting of tetrapropylammonium tetrafluoroborate (TPABF$_4$), tetrabutylammonium tetrafluoroborate (TBABF$_4$), lithium trifluoromethanesulfonate (LiOTf), potassium trifluoromethanesulfonate (KTf), and sodium trifluoromethanesulfonate (NaTf), but the ionic dopant is not limited thereto.

The light-emitting active layer may be formed by thermal evaporation, E-beam evaporation, atomic layer deposition, chemical vapor deposition, spin coating, dip coating, drop casting, or sputtering.

Also, the light-emitting active layer may also be formed in the shape of an organic wire by using an electric field aided robotic nozzle printer and thus, an organic wire light-emitting channel may be formed.

FIGS. 7a through 7d are cross-sectional views sequentially illustrating a method of forming a micropattern according to another embodiment of the present invention.

Figure 7A:
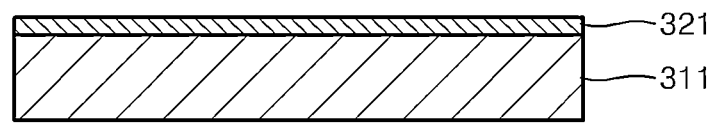
FIGS. 7a through 7d are cross-sectional views sequentially illustrating a method of forming a micropattern according to an embodiment of the present invention.

Referring to FIG. 7a, a pattern forming layer 321 is formed of a material to be formed as a pattern on a substrate 311.

The substrate 311 is not particularly limited and any material may be used so long as the material may withstand without deformation during dry or wet etching. Examples of the substrate 311 may be doped or undoped silicon, silicon oxide, silicon nitride, $SrTiO_3$, Nb-doped $SrTiO_3$, glass, polymer, metal, or a combination thereof, but the present invention is not limited thereto.

The pattern forming layer 321 may be a metal, conductor, semiconductor, or insulator thin film or pattern formed of typical organic polymer and organic low molecular weight materials, an inorganic material, and an organic-inorganic hybrid material. The pattern forming layer 321 may also include a arbitrary zero-dimensional material (examples: quantum dot semiconductors having a core of a nano-sized II-VI semiconductor particle (CdSe, CdTe, CdS, etc.), fullerene, and a graphene quantum dot), a 1-dimensional material (examples: a carbon nanotube, a nanowire, and a nanoribbon), or a 2-dimensional material (examples: graphene, $MoS_2$, hexagonal boron nitride (BN)). The pattern forming layer 321 may also be a photoresist pattern already formed. However, the pattern forming layer 321 is not limited thereto.

Figure 7B:
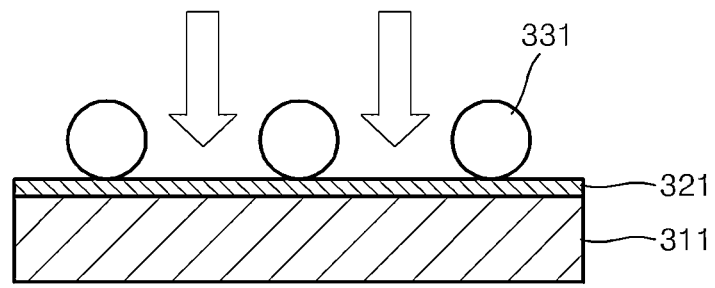

Referring to FIG. 7b, an organic wire or organic-inorganic hybrid wire 331 having a circular or elliptical cross section is formed on the pattern forming layer 321 as described above. The organic wire or organic-inorganic hybrid wire 331 having a circular or elliptical cross section may be formed by electric field aided robotic nozzle printing, direct tip drawing, meniscus-guided direct writing, melt spinning, wet spinning, dry spinning, gel spinning, or electrospinning, but the present invention is not limited thereto. The foregoing organic materials, i.e., an organic low molecular weight semiconductor, an organic polymer semiconductor, a conductive polymer, an insulating polymer, and a blend thereof, or a mixed material of the foregoing organic materials and the foregoing inorganic materials may be used as a material of the organic wire or organic-inorganic hybrid wire 331, but the present invention is not limited thereto. The organic wire or organic-inorganic hybrid wire 331 may be formed to have a diameter ranging from 10 nm to 100 μm.

Figure 7C:
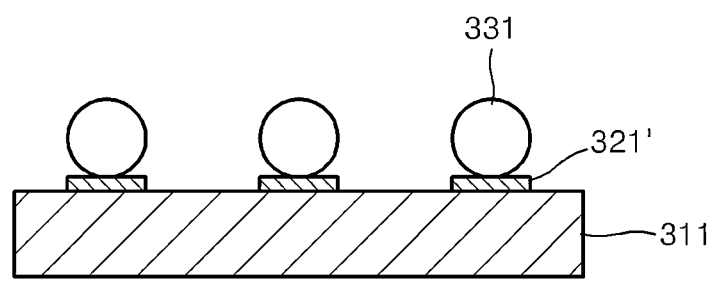

Referring to FIG. 7c, the pattern forming layer 321 is etched by using the organic wire or organic-inorganic hybrid wire 331 as an etching mask. Dry etching or wet etching may be used as an etching process. For example, a typical gas plasma etching process, reactive ion etching process, or ion beam milling process may be used as the dry etching process, but the dry etching process is not limited thereto. The wet etching process may be performed by selecting an appropriate etchant according to a type of the pattern forming layer 321. For example, a solution containing hydrofluoric acid (HF), such as a buffered oxide etch (BOE) solution, may be used in etching inorganic oxide and a mixed solution of HF and nitric acid may be used in etching silicon. Chromium may be etched with an ammonium nitrate solution and gold (Au) may be etched with a mixed solution of KI and $I_2$. Titanium (Ti) may be etched with a $FeCl_3$ solution or a Marble's reagent solution (typically, solution of 50 ml of HCl:50 ml of deionized water:10 g of $CuSO_4$). Hydrogen peroxide ($H_2O_2$) may be included in the etchant.

Figure 7D:
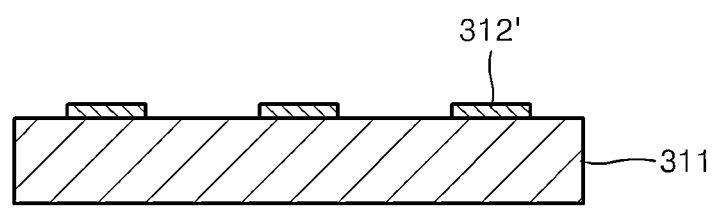

Referring to FIG. 7d, a final pattern 321' may be formed from the pattern forming layer 321 by removing the organic wire or organic-inorganic hybrid wire 331. The organic wire or organic-inorganic hybrid wire 331 may be removed by detaching the organic wire or organic-inorganic hybrid wire 331 by using adhesive force of an adhesive tape as the foregoing taping method, or may be removed by selectively dissolving the organic wire or organic-inorganic hybrid wire 331 in a solvent.

As described above, the method of forming a micropattern according to the present invention may be used in forming both a pattern having a microspacing and a pattern having a microdiameter. A microribbon or nanoribbon, or a quantum dot material formed from metal, an inorganic semiconductor, an organic semiconductor, or a graphene sheet, or an electronic device or optoelectronic device using thereof may be fabricated by using the method of forming a micropattern according to the present invention.

EXAMPLE 1

A pattern having a nanospacing formed of gold (Au) was prepared by using the method of forming a micropattern according to the embodiment of the present invention.

First, a nanowire mask pattern formed of a polymer material was formed on a substrate. In detail, poly(N-vinylcarbazole) (PVK) was first dissolved in styrene to prepare a PVK solution. The PVK solution was put in a syringe of an electric field aided robotic nozzle printer and the PVK solution was discharged from a nozzle while a voltage was applied to the nozzle. A PVK nanowire mask pattern was formed on the substrate on a collector moved by a robot stage.

At this time, a diameter of the nozzle used was 100 μm, a distance between the nozzle and the collector was 2.5 mm, an applied voltage was 4 kV, and a discharge speed of a solution was 500 nl/min. A movement spacing in a y-axis direction of the robot stage was 50 μm and a movement distance in an x-axis direction was 15 cm. A movement speed in the y-axis direction of the robot stage was 1,000 mm/min and a movement speed in the x-axis direction was 8,000 mm/min. A nanowire mask pattern having a diameter of about 450 nm which is elongated in the x-axis and has a spacing of about 50 μm in the y-axis direction was formed.

Subsequently, an Au layer was formed on an entire surface of the substrate having the nanowire mask pattern formed thereon by thermal evaporation. The Au layer was formed to a thickness of about 100 nm.

The PVK nanowire mask pattern was removed from the substrate by using a method of using adhesive force of an adhesive tape. Since the PVK nanowire mask pattern was in contact with the substrate in a minimum area and the thickness of the gold layer was lower than a diameter of the PVK nanowire mask pattern, the PVK nanowire mask pattern was cleanly removed from the substrate without being disconnected or remained. The gold layer on the PVK nanowire mask pattern was also removed as the PVK nanowire mask pattern was detached from the substrate, and thus, a gold pattern having a nanospacing was formed.

Figure 8:
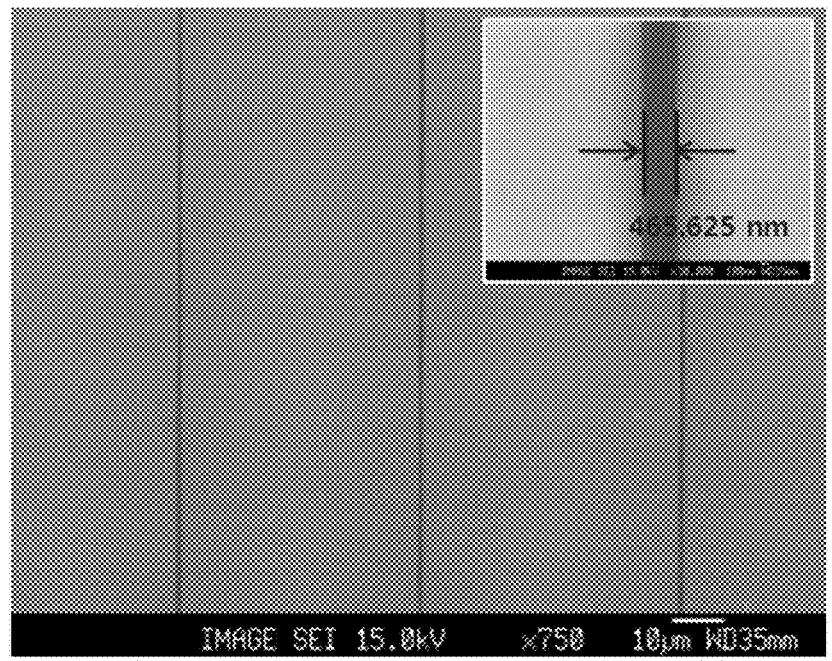
FIG. 8 is a scanning electron microscope (SEM) micrograph showing gold patterns having a nanospacing formed according to Example 1.

FIG. 8 is a SEM micrograph showing gold patterns having a nanospacing formed according to Example 1.

As a result of measurement of the SEM micrograph in FIG. 8, a width of the gold pattern having a nanospacing was 50 μm, which was matched with the spacing of the PVK nanowire mask pattern, and also, an average spacing between the gold patterns having a nanospacing was about 460 nm, which was almost matched with the diameter of the PVK nanowire mask pattern.

EXAMPLE 2

A square pattern formed of gold having a nanospacing was prepared by using the method of forming a micropattern according to the embodiment of the present invention.

First, an orthogonal pattern composed of polymer nanowire mask patterns having a width of about 460 nm and a spacing of about 50 μm was prepared on a substrate. The polymer nanowire mask pattern was formed of PVK. In detail, as described in Example 1, PVK was first dissolved in styrene to prepare a PVK solution. The PVK solution was put in a syringe of an electric field aided robotic nozzle printer and the PVK solution was discharged from a nozzle while a voltage of 4 kV was applied to the nozzle. A robot stage was moved in an x-axis direction to form a nanowire mask pattern in the x-axis direction and the robot stage was moved in a y-axis direction to form a nanowire mask pattern in the y-axis direction, and thus a nanowire mask orthogonal pattern was formed.

At this time, a diameter of the nozzle used was 100 μm, a distance between the nozzle and the collector was 2.5 mm, an applied voltage was 4 kV, and a discharge speed of a solution was 500 nl/min. When the nanowire mask pattern in the x-axis direction was formed, a movement spacing in the y-axis direction of the robot stage was 50 μm and a movement distance in the x-axis direction was 15 cm. At this time, a movement speed in the y-axis direction of the robot stage was 1,000 mm/min and a movement speed in the x-axis direction was 8,000 mm/min. Similarly, when the nanowire mask pattern in the y-axis direction was formed, a movement spacing in the x-axis direction of the robot stage was 50 μm and a movement distance in the y-axis direction was 15 cm. At this time, a movement speed in the x-axis direction of the robot stage was 1,000 mm/min and a movement speed in the y-axis direction was 8,000 mm/min.

Subsequently, a gold layer was formed on an entire surface of the substrate having the polymer nanopattern formed thereon by thermal evaporation. The gold layer was formed to a thickness of 100 nm.

The PVK nanowire mask pattern was removed from the substrate by using a sonication method in an organic solvent. Chloroform was used as the organic solvent. The gold layer on the PVK nanowire mask pattern was also removed as the PVK nanowire mask pattern was detached from the substrate, and thus, a square pattern formed of a gold layer having a nanospacing was formed.

Figure 9:
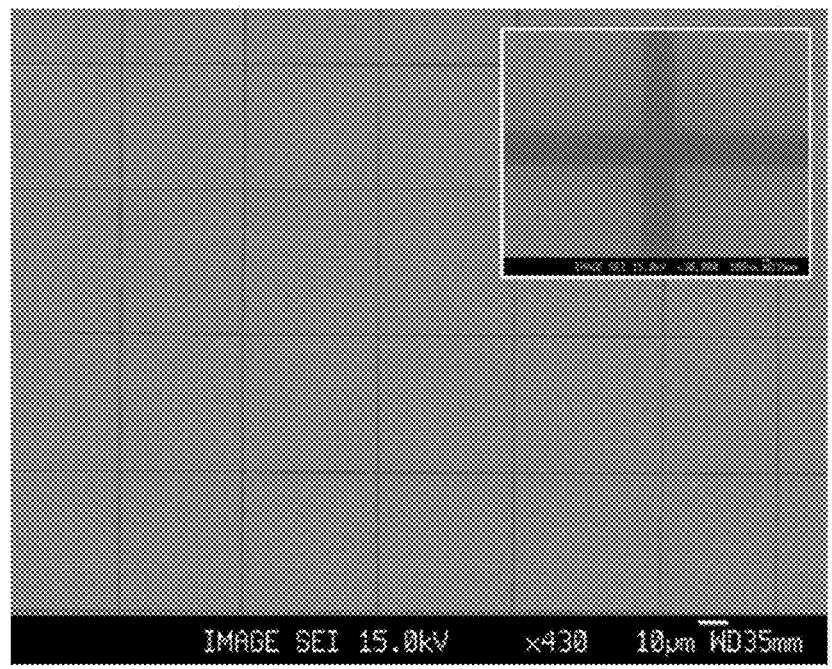
FIG. 9 is a SEM micrograph showing square patterns formed of gold having a nanospacing that is formed according to Example 2.

FIG. 9 is a SEM micrograph showing square patterns formed of gold having a nanospacing that is formed according to Example 2. As a result of measurement of the SEM micrograph in FIG. 9, a width of the square gold pattern was 50 μm, which was matched with the spacing of the nanowire mask pattern, and also, an average spacing between the square gold patterns was about 460 nm, which was almost matched with the diameter of the nanowire mask pattern.

EXAMPLE 3

A nanochannel thin film transistor was fabricated by using the method of forming a micropattern according to the embodiment of the present invention.

A titanium (Ti) gate electrode having a width of 600 μm and a thickness of 30 nm was formed on a silicon wafer. An aluminum oxide ($Al_2O_3$) gate dielectric layer having a thickness of 50 nm was formed on the gate electrode by atomic layer deposition. Gold electrodes having a spacing of 340 nm and a thickness of 70 nm were formed on the gate dielectric layer as source and drain electrodes.

First, a nanowire mask pattern having a diameter of about 350 nm and a spacing of about 5.5 mm was formed on a substrate having the Ti gate electrode and the $Al_2O_3$ gate dielectric layer formed thereon in order to form the gold electrodes having a nanospacing. The nanowire mask pattern was formed of PVK.

In detail, as described in Example 1, PVK was first dissolved in styrene to prepare a PVK solution. The PVK solution was put in a syringe of an electric field aided robotic nozzle printer and the PVK solution was discharged from a nozzle while a voltage was applied to the nozzle. A PVK nanowire mask pattern was formed on the substrate on a collector moved by a robot stage. A gold layer was formed on the PVK nanowire mask pattern by thermal evaporation. The PVK nanowire mask pattern was removed from the substrate by using a method of using adhesive force of an adhesive tape. The gold layer on the PVK nanowire mask pattern was also removed as the PVK nanowire mask pattern was detached from the substrate, and thus, a quadrangular pattern formed of gold having a nanospacing was formed.

At this time, a diameter of the nozzle used was 100 μm, a distance between the nozzle and the collector was 2.5 mm, an applied voltage was 4 kV, and a discharge speed of a solution was 500 nl/min. A movement spacing in a y-axis direction of the robot stage was 5.5 mm and a movement distance in an x-axis direction was 15 cm. A movement speed in the y-axis direction of the robot stage was 1,000 mm/min and a movement speed in the x-axis direction was 8,000 mm/min.

A 50 nm thick pentacene active layer was formed on the gate dielectric layer and the gold electrodes having a nanospacing by using a shadow mask through thermal evaporation.

Figure 10A:
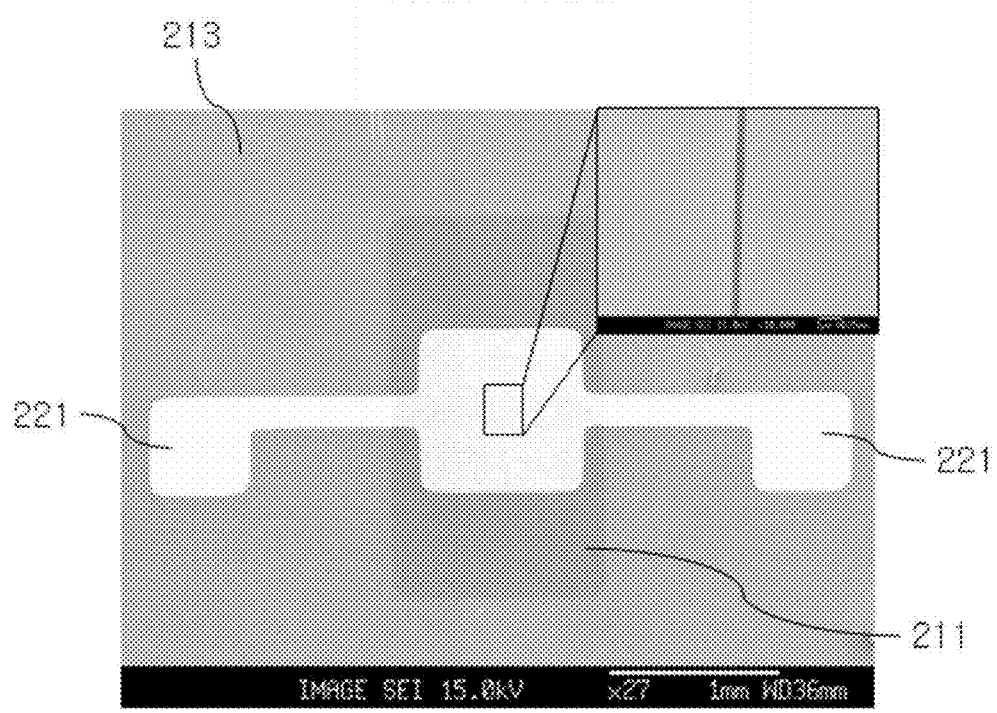
FIGS. 10a and 10b are SEM micrographs showing a nanochannel pentacene thin film transistor formed according to Example 3.
Figure 10B:
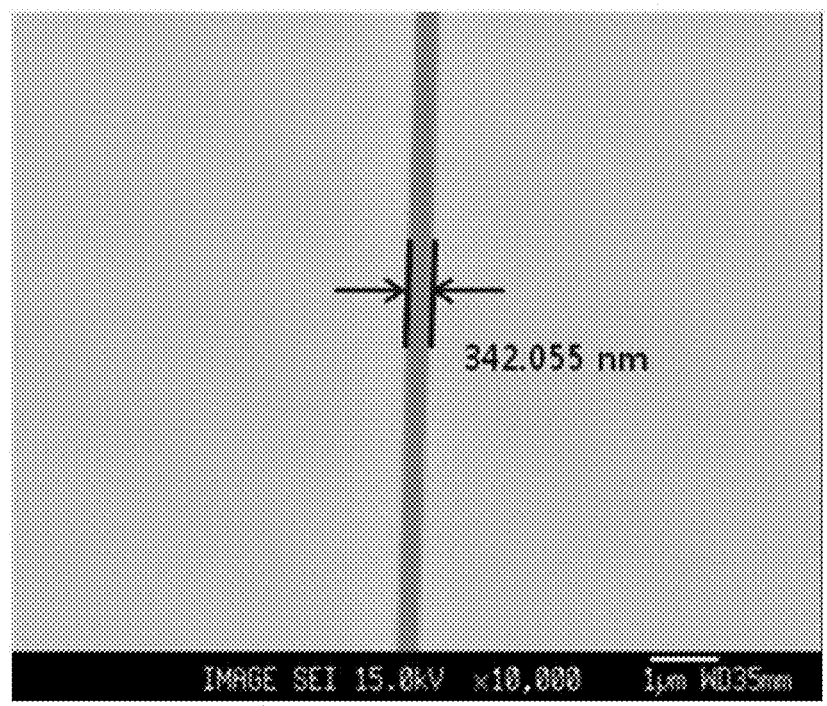

FIGS. 10a and 10b are SEM micrographs showing a nanochannel pentacene thin film transistor formed according to Example 3.

Referring to the SEM micrograph of FIG. 10a, a Ti gate electrode 211 was formed on a silicon substrate and an aluminum oxide gate dielectric layer 213 was formed on the gate electrode 211 and an entire surface of the substrate. Au source and drain electrodes 221 having a nanospacing were formed on the gate dielectric layer 213.

The SEM micrograph of FIG. 10b is a photograph magnifying a portion of a spacing of the Au source and drain electrodes 221 in the SEM micrograph of FIG. 10a. In the SEM micrograph of FIG. 10b, the spacing of the Au source and drain electrodes 221 was about 340 nm, which was almost matched with the thickness of the polymer nanowire mask pattern. In FIGS. 10a and 10b, since the pentacene active layer on the gold electrodes 221 was transparent, the pentacene active layer was not identified.

Figure 11:
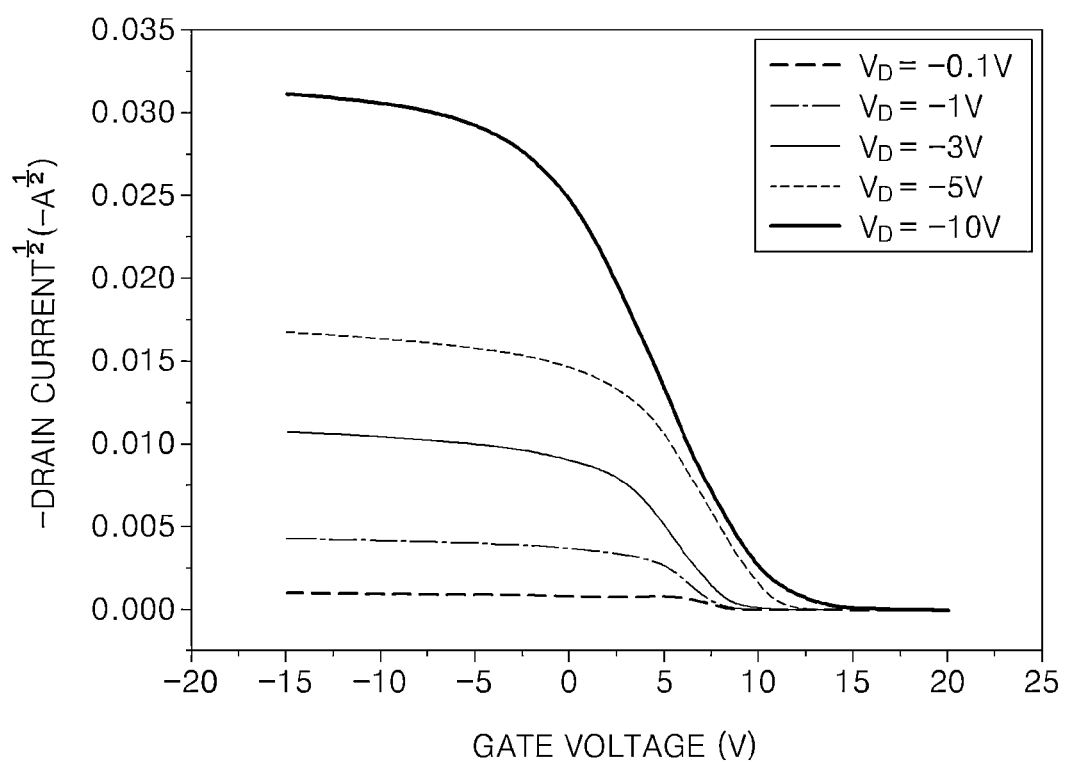
FIG. 11 is a graph illustrating a drain current vs. a gate voltage of the nanochannel pentacene thin film transistor formed according to Example 3.

FIG. 11 is a graph illustrating a drain current vs. a gate voltage of the nanochannel pentacene thin film transistor formed according to Example 3. It may be confirmed from the graph of FIG. 11 that the drain current increases when the gate voltage (absolute value) was increased with respect to a specific drain voltage and the drain current increases when the drain voltage (absolute value) was increased with respect to a specific gate voltage. Referring to the graph in FIG. 11, mobility of the nanospacing thin film transistor was measured as 0.041 $cm^2/V \cdot s$ and it may be understood that the transistor was stably operated.

EXAMPLE 4

A nanochannel organic nanowire transistor was fabricated by using the method of forming a micropattern according to the embodiment of the present invention. In Example 3, pentacene was deposited on entire surfaces of the source and drain electrodes having a nanospacing. However, in the present example, an active layer, i.e., a channel, was formed by forming an organic semiconductor nanowire on source and drain electrodes having a nanospacing.

The nano-spaced source and drain electrodes formed of gold and having a spacing of 340 nm and a thickness of 100 nm were formed on a p-doped silicon wafer having a 100 nm thick silicon oxide ($SiO_2$) layer formed thereon in the same manner as Example 3. At this time, the p-doped silicon wafer and the silicon oxide layer were used as a gate electrode and a gate dielectric layer, respectively.

A P3HT nanowire channel was formed on the nano-spaced source and drain electrodes. In order to form the P3HT nanowire channel, powder, in which P3HT and PEO (molecular weight about 400,000) were mixed at a weight ratio of 7:3, was first dissolved in a mixed solution having a weight ratio of chlorobenzene:trichloroethylene of 2:1 to prepare a P3HT solution. In the P3HT solution, a concentration of P3HT was 2.6 wt % based on a total solution and a concentration of PEO was 1.1 wt %.

The P3HT solution was put in a syringe of an electric field aided robotic nozzle printer and the P3HT solution was discharged from a nozzle while a voltage of 1.5 kV was applied to the nozzle. A P3HT nanowire channel was formed on the silicon wafer having the gate electrode, the gate dielectric layer, and the source and drain electrodes formed thereon on a collector moved by a robot stage. At this time, a diameter of the nozzle used was 100 μm, a distance between the nozzle and the collector was 5.5 mm, an applied voltage was 1.5 kV, and a discharge speed of a solution was 200 nl/min. A movement spacing in a y-axis direction of the robot stage was 5.5 mm and a movement distance in an x-axis direction was 15 cm. A movement speed in the y-axis direction of the robot stage was 1,000 mm/min and a movement speed in the x-axis direction was 30,000 mm/min. A size of the collector was 20 cm×20 cm and a size of the substrate on the collector was 8 cm×8 cm.

Figure 12:
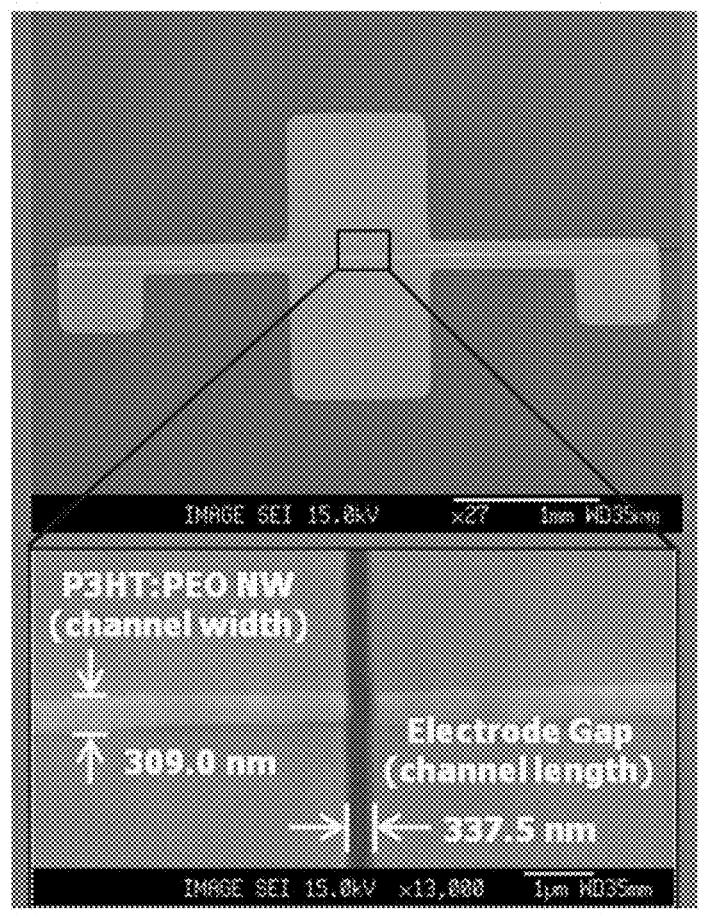
FIG. 12 is a SEM micrograph showing a nanochannel organic nanowire transistor formed according to Example 4.

FIG. 12 is a SEM micrograph showing a nanochannel organic nanowire thin film transistor formed according to Example 4. Referring to FIG. 12, an organic wire channel crossing over the source and drain electrodes having a nanospacing may be seen. In FIG. 12, a portion of the spacing of the source and the drain electrodes was marked in a rectangle and magnified, and it may be confirmed in the magnified micrograph that the spacing of the source and the drain electrodes corresponding to a channel length was 337.5 nm and a width of P3HT:PEO nanowire corresponding to a channel width was 309.0 nm.

Figure 13:
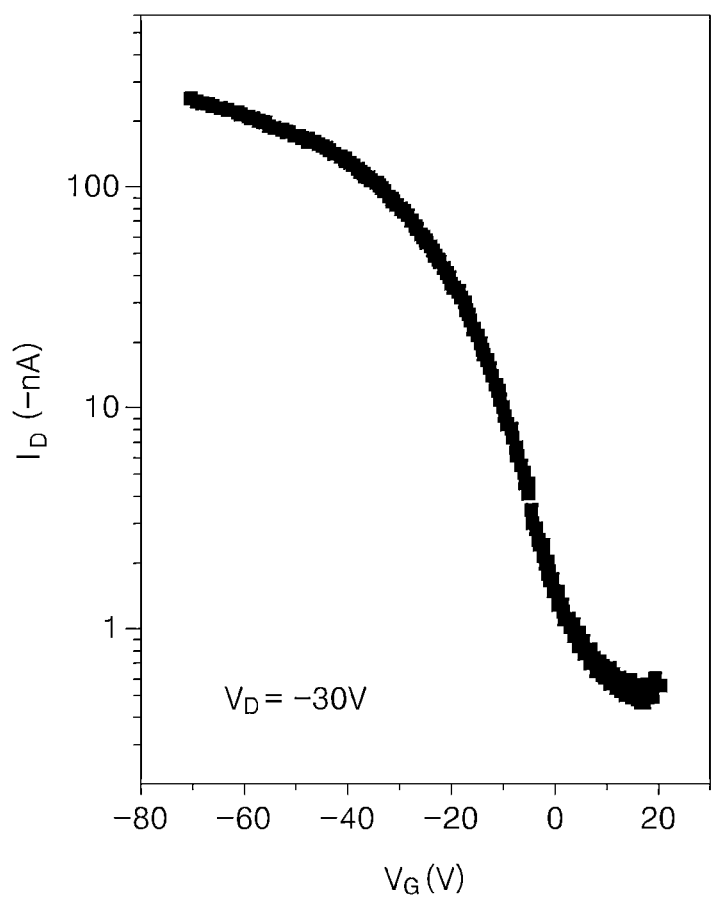
FIG. 13 is a graph illustrating a drain current vs. a gate voltage of the nanochannel organic nanowire transistor formed according to Example 4.

FIG. 13 is a graph illustrating a drain current vs. a gate voltage of the nanochannel organic nanowire transistor formed according to Example 4. Referring to the graph, mobility of a charge (hole) was calculated as 0.0021 $cm^2/V \cdot s$ and a ratio of on/off current was calculated as $5.25 \times 10^2$.

EXAMPLE 5

A pattern formed of a graphene nanoribbon having a nanospacing was prepared by using the method of forming a micropattern according to the embodiment of the present invention.

(a) Formation and Transfer of Monolayer Graphene

A copper (Cu) foil (9 cm×15 cm) was put in a tubular furnace and the temperature was increased to 1000° C. while 8 sccm of $H_2$ was provided at a pressure of 90 mtorr, and the temperature was then maintained for 30 minutes to form copper grains on the Cu foil. Thereafter, at a temperature of 1000° C., 24 sccm of $CH_4$ and 8 sccm of $H_2$ were provided at a pressure of 460 mtorr for 30 minutes, and the temperature was then decreased to room temperature while 8 sccm of $H_2$ was provided at a pressure of 90 mtorr to form monolayer graphene on the copper foil.

Thereafter, a poly(methyl methacrylate) (PMMA) layer was in contact with the monolayer graphene and pressurized to form a film composed of copper foil/monolayer graphene/PMMA layer. The film composed of copper foil/monolayer graphene/PMMA layer thus formed was immersed in an aqueous ammonium persulfate solution (2 wt %), a copper etchant, for 5 to 6 hours and then cleaned with deionized water to remove the copper foil, and thus, a film composed of monolayer graphene/PMMA layer was obtained.

Subsequently, the monolayer graphene/PMMA layer was disposed on a silicon substrate so as to allow the monolayer graphene to be in contact with a surface of the 5-inch silicon substrate and an upper portion of the PMMA layer was then pressurized at a temperature of about 100° C. to transfer the monolayer graphene on the silicon substrate.

Meanwhile, graphene may be formed on large-area silicon according to a paper published by 8 co-researchers in addition to Younbin Lee, *Nano Letters,* 10, 490-493 (2010).

(b) Organic Nanowire Formation

A PVK nanowire mask pattern was formed on the monolayer graphene on the silicon substrate formed in operation (a). The PVK nanowire mask pattern was formed in the same manner as Example 1.

(c) Patterning of Monolayer Graphene

Monolayer graphene was selectively etched by using the PVK nanowire mask pattern as an etching mask through an oxygen plasma etching process (70 mTorr, 100 W, 3 sec). The PVK nanowire mask pattern was dissolved in a chlorobenzene solvent and sonication was then performed to selectively remove the PVK nanowire mask pattern from the substrate. As a result, a graphene nanoribbon having a width of 10 nm was formed.

EXAMPLE 6

A F8T2 thin film light-emitting transistor having a nanochannel was fabricated by using the method of forming a micropattern according to the embodiment of the present invention.

Nano-spaced source and drain electrodes formed of gold having a spacing of 300 nm and a thickness of 100 nm were formed on a p-doped silicon wafer having a 300 nm thick $SiO_2$ layer formed thereon in the same manner as Examples 3 and 4. At this time, the p-doped silicon wafer and the silicon oxide layer were used as a gate electrode and a gate dielectric layer, respectively. The nano-spaced source and drain electrodes were prepared by using a PVK nanowire having a diameter of 300 nm as a nanowire mask pattern.

In detail, as described in Example 1, PVK was first dissolved in styrene to prepare a PVK solution. The PVK solution was put in a syringe of an electric field aided robotic nozzle printer and the PVK solution was discharged from a nozzle while a voltage was applied to the nozzle. A PVK nanowire mask pattern was formed on the substrate on a collector moved by a robot stage. A gold layer was formed on the PVK nanowire mask pattern by thermal evaporation. The PVK nanowire mask pattern was removed from the substrate by using a method of using adhesive force of an adhesive tape. The gold layer on the PVK nanowire mask pattern was also removed as the PVK nanowire mask pattern was detached from the substrate, and thus, source and drain electrodes formed of gold having a nanospacing was formed.

At this time, a diameter of the nozzle used was 100 μm, a distance between the nozzle and the collector was 2.5 mm, an applied voltage was 4.2 kV, and a discharge speed of a solution was 500 nl/min. A movement spacing in a y-axis direction of the robot stage was 5.5 mm and a movement distance in an x-axis direction was 15 cm. A movement speed in the y-axis direction of the robot stage was 1,000 mm/min and a movement speed in the x-axis direction was 8,000 mm/min.

A F8T2 thin film channel was formed on the nano-spaced source and drain electrodes through spin coating. At this time, a F8T2 solution used in the spin coating was prepared by dissolving 1 wt % F8T2 in dichlorobenzene and adding TPABF$_4$ as an ionic dopant in an amount of 10% of F8T2 thereto. The spin coating was performed at 500 rpm for 5 seconds and then performed at 2000 rpm for 90 seconds.

Figure 14:
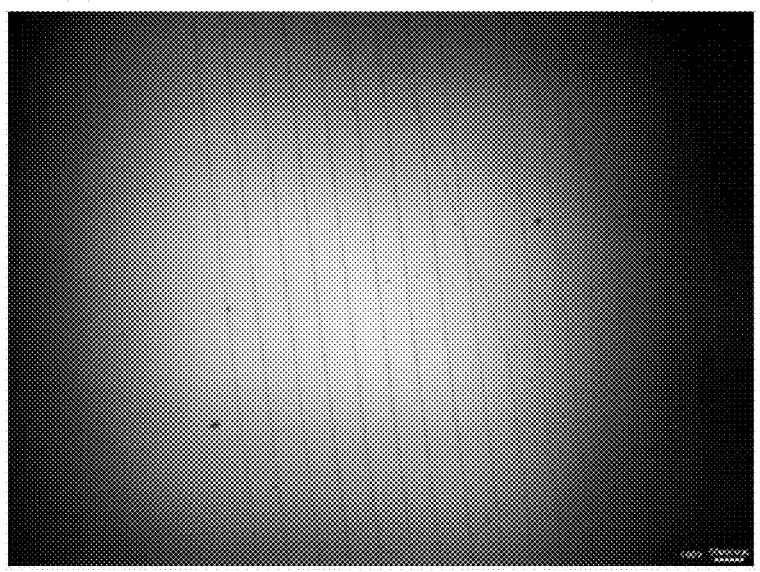
FIG. 14 is an optical micrograph showing a nanochannel F8T2 thin film light-emitting transistor formed according to Example 6.

FIG. 14 is an optical micrograph showing a nanochannel F8T2 thin film light-emitting transistor formed according to Example 6. A light-emitting F8T2 channel between nano-sized source and drain may be seen in FIG. 14.

The invention claimed is:

1. A method of forming a micropattern, the method comprising:
forming an organic wire or organic-inorganic hybrid wire mask pattern having a circular or elliptical cross section on a substrate;
forming a material layer on an entire surface of the substrate having the organic wire or organic-inorganic hybrid wire mask pattern formed thereon; and
removing the organic wire or organic-inorganic hybrid wire mask pattern from the substrate to allow only the material layer on a portion of the substrate having no organic wire or organic-inorganic hybrid wire mask pattern formed thereon to be remained.

2. The method of claim 1, wherein the organic wire or organic-inorganic hybrid wire mask pattern having a circular or elliptical cross section is prepared by electric field aided robotic nozzle printing, direct tip drawing, meniscus-guided direct writing, melt spinning, wet spinning, dry spinning, gel spinning, or electrospinning.

3. The method of claim 2, wherein the electric field aided robotic nozzle printing is performed by using an electric field aided robotic nozzle printer comprising a solution storage apparatus supplying a solution for discharge, a nozzle discharging the solution supplied from the solution storage apparatus, a voltage applying apparatus applying high voltage to the nozzle, a flat and movable collector on which an organic wire or an organic-inorganic hybrid wire formed by being discharged from the nozzle is aligned, a robot stage installed under the collector to move the collector in x-y directions (horizontal direction), a micro distance controller controlling a distance between the nozzle and the collector in a z direction (vertical direction), and a base plate disposed under the robot stage to maintain flatness of the collector and inhibit vibration generated during operation of the robot stage.

4. The method of claim 3, wherein the distance between the nozzle and the collector is in a range of 10 μm to 20 mm.

5. The method of claim 1, wherein the forming of the organic wire or organic-inorganic hybrid wire mask pattern through the electric field aided robotic nozzle printing comprises:
mixing an organic or organic-inorganic hybrid material with distilled water or an organic solvent to prepare an organic solution;
putting the organic solution in the solution storage apparatus of the electric field aided robotic nozzle printer;
discharging the organic solution in the solution storage apparatus from the nozzle while applying high voltage to the nozzle through the voltage applying apparatus of the electric field aided robotic nozzle printer; and
aligning an organic wire or an organic-inorganic hybrid wire formed from the organic solution discharged from the nozzle on the substrate on the collector while moving the collector.

6. The method of claim 5, wherein the organic material comprises an organic low molecular weight semiconductor, an organic polymer semiconductor, a conductive polymer, an insulating polymer, or a blend thereof.

7. The method of claim 6, wherein the organic material comprises an organic low molecular weight semiconductor material selected from the group consisting of 6,13-bis(triisopropylsilylethynyl pentacene), triethylsilylethynyl anthradithiophene (TES ADT), and [6,6]-phenyl C61 butyric acid methyl ester (PCBM), an organic polymer semiconductor/conductive polymer material selected from the group consisting of polythiophene, poly(3-hexylthiophene) (P3HT), poly (3,4-ethylenedioxythiophene) (PEDOT), poly(9-vinylcarbazole) (PVK) or a derivative thereof, poly(p-phenylene vinylene) or a derivative thereof, polyfluorene or a derivative thereof, poly(spiro-fluorene) or a derivative thereof, polyaniline or a derivative thereof, and polypyrrole or a derivative thereof, or an organic insulating polymer selected from the group consisting of polyethylene oxide (PEO), polystyrene (PS), polycaprolactone (PCL), polyacrylonitrile (PAN), poly(methyl methacrylate) (PMMA), polyimide, poly(vinylidene fluoride) (PVDF), and polyvinylchloride (PVC).

8. The method of claim 5, wherein the organic-inorganic hybrid material comprises at least one or more of a semiconductor having a shape of nano-sized particle, wire, ribbon, or rod, metal, metal oxide, a metal or metal oxide precursor, a carbon nanotube (CNT), reduced graphene oxide, graphene, a graphene quantum dot, a graphene nanoribbon, graphite, or a quantum dot having a core of a nano-sized compound semiconductor particle.

9. The method of claim 1, wherein a diameter of the organic wire or organic-inorganic hybrid wire mask pattern is in a range of 10 nm to 100 μm.

10. The method of claim 1, wherein the organic wire or organic-inorganic hybrid wire mask pattern has a random oriented pattern or an aligned pattern.

11. The method of claim 10, wherein an angle between two or more parallel wires in the aligned pattern of the organic wires or the organic-inorganic hybrid wires has a tolerance ranging from 0 degrees to 10 degrees.

12. The method of claim 10, wherein the aligned pattern of the organic wires or the organic-inorganic hybrid wires has a straightness ranging from 0% to 10% with respect to a diameter of each wire.

13. The method of claim 1, wherein the material layer comprises metal, a semiconductor inorganic material, a conductive inorganic material, an insulating inorganic material, an organic polymer semiconductor, an organic low molecular weight semiconductor, an organic conductive polymer, an organic insulating polymer, or a blend thereof.

14. The method of claim 13, wherein the material layer comprises metal or a conductive inorganic material selected from the group consisting of gold, platinum, silver, nickel, copper, aluminum, titanium, cobalt, iron, tungsten, ruthenium, rhodium, palladium, molybdenum, cadmium, vanadium, chromium, zinc, indium, iridium, lithium, tin, lead, and an alloy thereof, a semiconductor inorganic material selected from the group consisting of p- or n-doped silicon, zinc oxide (ZnO), indium oxide, indium tin oxide (ITO), indium zinc oxide (IZO), silicon, and germanium, an insulating inorganic material selected from the group consisting of $SiO_2$ and SiN, an organic polymer semiconductor/an organic conductive polymer selected from the group consisting of P3HT, poly 3-octylthiophene (P3OT), poly butylthiophene (PBT), PEDOT/polystyrenesulfonate (PSS), poly(9,9'-dioctylfluorene-co-bithiophene) (F8T2), polyphenylenevinylene or a derivative thereof, poly(thienylene vinylene) (PTV) or a derivative thereof, polyacetylene or a derivative thereof, polyaniline or a derivative thereof, polypyrrole or a derivative thereof, and polyfluorene or a derivative thereof, an organic low molecular weight semiconductor selected from the group consisting of triisopropylsilylethynyl (TIPS) pentacene, pentacene, tetracene, anthracene, rubrene, and alpha-hexathienylene ($\alpha$-6T), an organic insulating polymer selected from the group consisting of PEO, PS, PCL, PAN, PMMA, polyimide, PVDF, and PVC, and a blend thereof.

15. The method of claim 1, wherein the removing of the organic wire or organic-inorganic hybrid wire mask pattern from the substrate comprises lifting off the organic wire or organic-inorganic hybrid wire mask pattern by using an adhesive tape.

16. The method of claim 1, wherein the removing of the organic wire or organic-inorganic hybrid wire mask pattern from the substrate comprises dipping the substrate having the material layer deposited thereon in an organic solvent for sonication and sonicating the organic solvent for sonication with high-frequency waves.

17. The method of claim 1, wherein the micropattern formed by using the aligned pattern of the organic wires or the organic-inorganic hybrid wires has a width ranging from 10 nm to 100 cm.

* * * * *